(12) United States Patent
Fujiwara et al.

(10) Patent No.: US 10,881,019 B2
(45) Date of Patent: Dec. 29, 2020

(54) COOLING APPARATUS

(71) Applicant: FUJITSU LIMITED, Kawasaki (JP)

(72) Inventors: Shinnosuke Fujiwara, Kawasaki (JP); Nobumitsu Aoki, Kawasaki (JP); Hideo Kubo, Kawasaki (JP); Keita Hirai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/292,209

(22) Filed: Mar. 4, 2019

(65) Prior Publication Data

US 2019/0281727 A1 Sep. 12, 2019

(30) Foreign Application Priority Data

Mar. 9, 2018 (JP) ................................. 2018-043263
May 31, 2018 (JP) ................................. 2018-105308

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC .............. H05K 7/20236; H05K 7/203; H05K 7/20872–20881; H05K 7/20927–20936; H01L 23/44; H01L 23/46; H01L 23/473
(Continued)

(56) References Cited

U.S. PATENT DOCUMENTS 4,765,397 A 8/1988 Chrysler et al.
5,021,924 A 6/1991 Kieda et al.
(Continued)

FOREIGN PATENT DOCUMENTS

JP 61-94317 U 6/1986
JP 63-138799 6/1988
(Continued)

OTHER PUBLICATIONS

Omnexus, Density of Plastic: Technical Properties, 1999 (Year: 1999).*
(Continued)

*Primary Examiner* — Zachary Pape
*Assistant Examiner* — Amir A Jalali
(74) *Attorney, Agent, or Firm* — Fujitsu Patent Center

(57) ABSTRACT

A cooling apparatus includes an immersion-tank configured to store a refrigerant, a refrigerant suction port formed at a lower portion of the immersion-tank, the refrigerant suction port being configured to suck the refrigerant from an outside of the immersion-tank into an inside of the immersion-tank, an electronic device immersed in the refrigerant, the electronic device including, a first heat-generation portion, a second heat-generation portion having a heat-generation amount smaller than a heat-generation amount of the first heat-generation portion, and a refrigerant inlet positioned below the first heat-generation portion and the second heat-generation portion and being open downward, and a block positioned below the first heat-generation portion and the second heat-generation portion, the block including a through-hole through which a region positioned below the first heat-generation portion in the refrigerant inlet is open, and a closing portion that closes a region positioned below the second heat-generation portion in the refrigerant inlet.

14 Claims, 24 Drawing Sheets

(58) Field of Classification Search
USPC .......... 361/699–700; 165/80.4–80.5, 104.33; 257/712, 714; 174/547–548
See application file for complete search history.

(56) References Cited

U.S. PATENT DOCUMENTS

| | | | | |
|---|---|---|---|---|
| 5,023,695 | A * | 6/1991 | Umezawa | H01L 23/4735 257/714 |
| 5,097,385 | A * | 3/1992 | Chao-Fan Chu | H01L 23/4336 165/104.33 |
| 5,168,348 | A * | 12/1992 | Chu | H01L 23/367 257/713 |
| 5,228,502 | A * | 7/1993 | Chu | H01L 23/4336 165/142 |
| 5,270,572 | A * | 12/1993 | Nakajima | H01L 23/4735 165/104.33 |
| 8,851,154 | B2 * | 10/2014 | Cheng | F21V 29/006 165/104.21 |
| 2007/0256810 | A1 * | 11/2007 | Di Stefano | H01L 23/473 165/46 |
| 2009/0294106 | A1 * | 12/2009 | Flotta | H01L 23/4735 165/104.33 |
| 2010/0103614 | A1 * | 4/2010 | Campbell | H05K 7/203 361/689 |
| 2014/0071627 | A1 * | 3/2014 | Campbell | H05K 7/20809 361/700 |
| 2015/0109729 | A1 * | 4/2015 | Campbell | H05K 7/203 361/679.47 |
| 2015/0109735 | A1 * | 4/2015 | Campbell | H05K 7/20318 361/700 |
| 2016/0007501 | A1 | 1/2016 | Nakanishi et al. | |
| 2018/0020572 | A1 | 1/2018 | Fujiwara et al. | |
| 2019/0239390 | A1 * | 8/2019 | Goode | G06F 1/20 |
| 2019/0357384 | A1 * | 11/2019 | Saito | G06F 1/20 |

FOREIGN PATENT DOCUMENTS

| | | |
|---|---|---|
| JP | 02-082561 | 3/1990 |
| JP | 2018-011001 | 1/2018 |
| WO | 2014/147837 | 9/2014 |

OTHER PUBLICATIONS

The Engineering Tool Box, Density Weight and Specific Gravity, 2001 (Year: 2001).*

* cited by examiner

FIG. 8
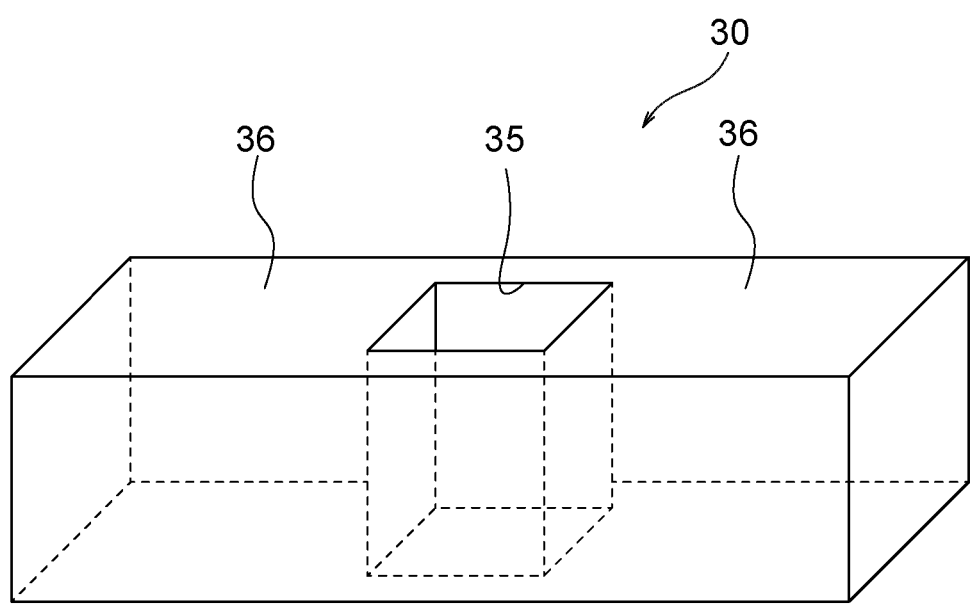
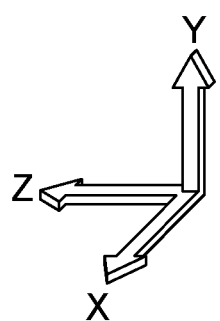

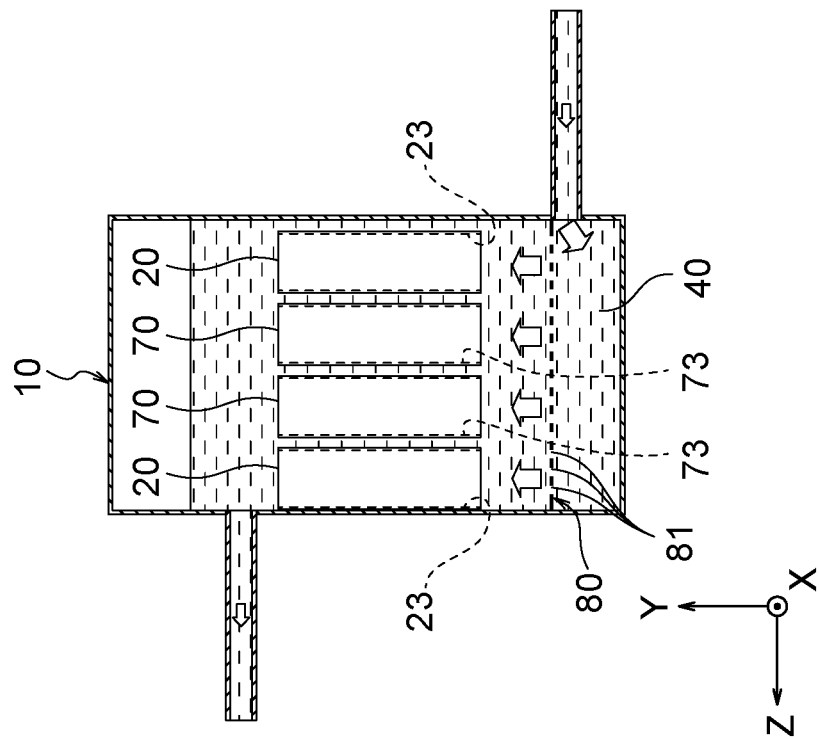
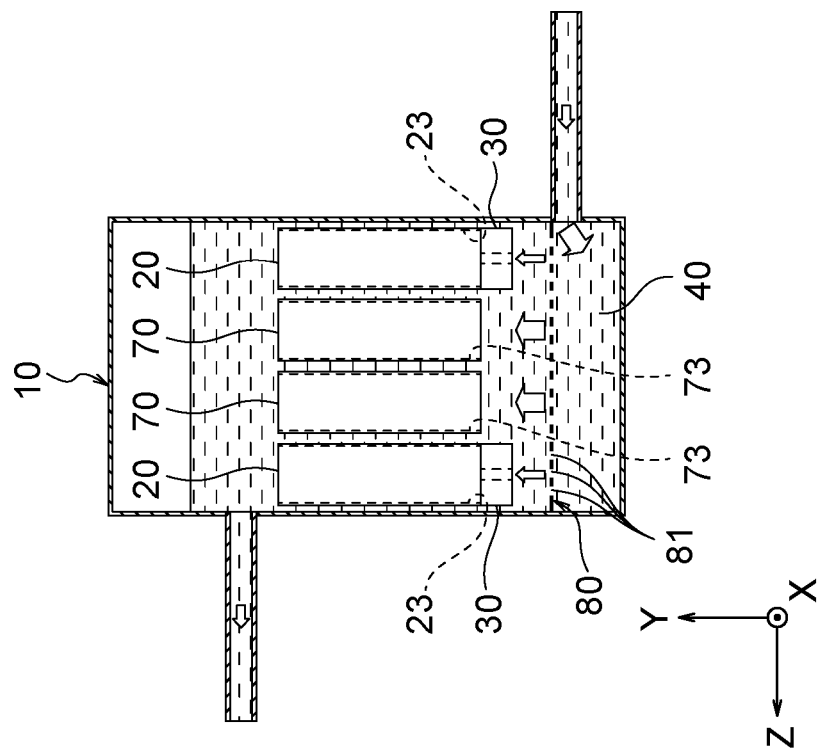

FIG. 21
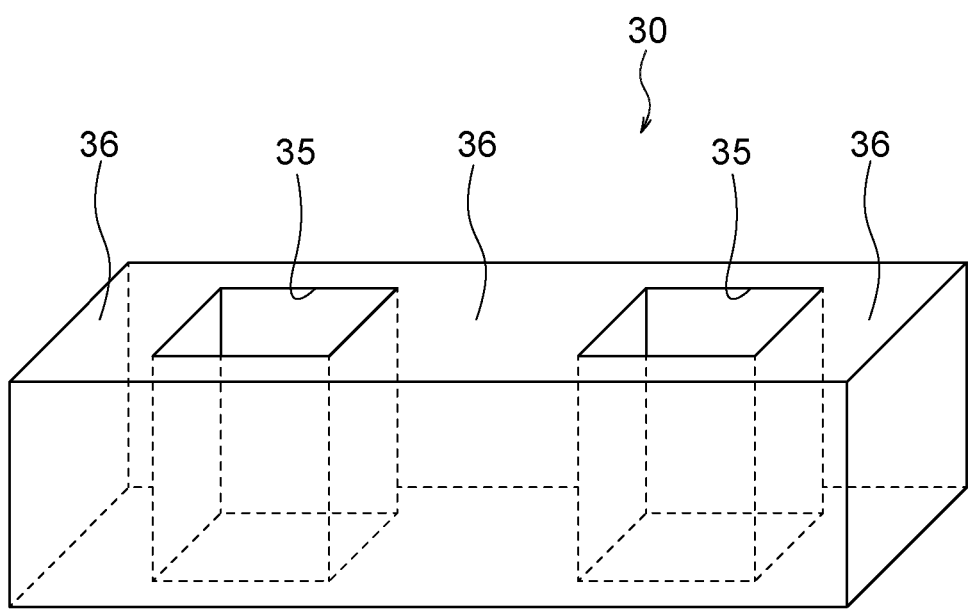
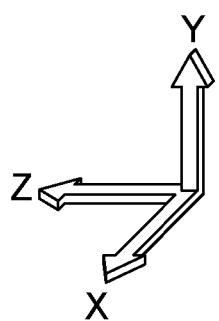

FIG. 23
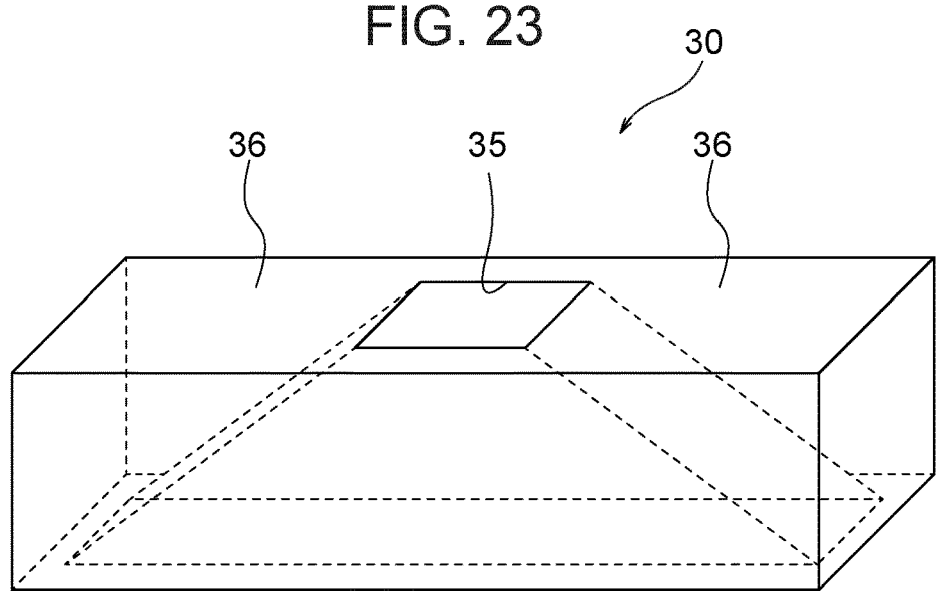
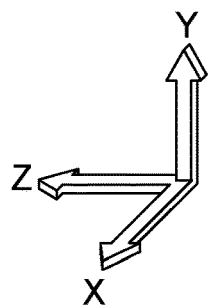
FIG. 24
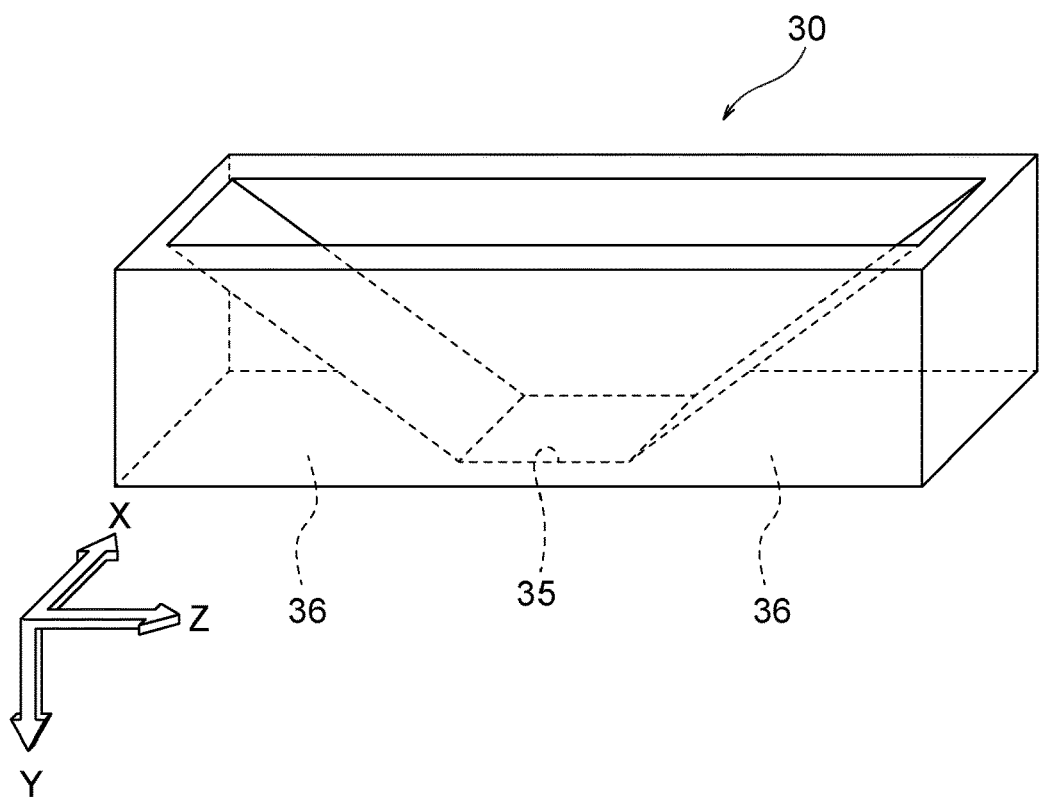

COOLING APPARATUS

CROSS-REFERENCE TO RELATED APPLICATIONS

This application is based upon and claims the benefit of priority of the prior Japanese Patent Application No. 2018-105308, filed on May 31, 2018, and the prior Japanese Patent Application No. 2018-43263, filed on Mar. 9, 2018, the entire contents of which are incorporated herein by reference.

FIELD

The embodiments disclosed herein are related to a cooling apparatus.

BACKGROUND

As an electronic apparatus, there is a device that includes an immersion tank that stores a refrigerant, and an electronic device that is immersed in the refrigerant (for example, refer to Japanese Laid-open Patent Publication No. 2018-011001). In such an electronic apparatus, in a case where an electronic device has a high-heat generation portion and a low-heat generation portion, when the electronic device is merely immersed in the refrigerant, since the refrigerant is also supplied to the low-heat generation portion in addition to the high-heat generation portion, the cooling efficiency for the high-heat generation portion is lowered.

To improve the cooling efficiency for the high-heat generation portion, it is conceivable to increase a flow rate of a refrigerant to be supplied to the high-heat generation portion by using a pump or the like that supplies the refrigerant. However, in this case, the power consumption of the pump increases and thus the operation cost of the electronic apparatus may increase.

Thus, a technology has been proposed in which a panel having a plurality of holes is arranged between a refrigerant suction port of an immersion tank and an electronic device, and the size of each hole is adjusted so that an appropriate amount of a refrigerant is supplied to each heat generation portion of the electronic device (for example, refer to Japanese Laid-open Patent Publication No. 63-138799).

However, in this technology, since the volume of the panel relative to the capacity of the immersion tank is small, it is difficult to reduce the amount of the refrigerant to be used, and thus a large amount of the refrigerant is used, resulting in an increase in cost. Therefore, there is still room for improvement in order to reduce the amount of the refrigerant to be used while improving the cooling efficiency for the high-heat generation portion.

Japanese Laid-open Patent Publication No. 2-82561, International Publication Pamphlet No. WO 2014/147837, and Japanese Unexamined Utility Model Registration Application Publication No. 61-94317 are examples of the related art.

SUMMARY

According to an aspect of the embodiments, a cooling apparatus includes an immersion tank configured to store a refrigerant, a refrigerant suction port formed at a lower portion of the immersion tank, the refrigerant suction port being configured to suck the refrigerant from an outside of the immersion tank into an inside of the immersion tank, an electronic device immersed in the refrigerant, the electronic device including, a first heat generation portion, a second heat generation portion having a heat generation amount smaller than a heat generation amount of the first heat generation portion, and a refrigerant inlet positioned below the first heat generation portion and the second heat generation portion and being open downward, and a block positioned below the first heat generation portion and the second heat generation portion, the block including a through-hole through which a region positioned below the first heat generation portion in the refrigerant inlet is open, and a closing portion that closes a region positioned below the second heat generation portion in the refrigerant inlet.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a perspective view of a block used in the electronic apparatus of FIG. 7;

FIGS. 15A and 15B are diagrams for comparing a case where the electronic apparatus of FIG. 13 is provided with a block and a case where the electronic apparatus of FIG. 13 is not provided with a block;

FIG. 21 is a perspective view of a block used in the electronic apparatus of FIG. 20;

FIG. 23 is a perspective view of a block according to a first modification example;

FIG. 24 is a perspective view of the block of FIG. 23 as viewed from a direction different from that of FIG. 23;

DESCRIPTION OF EMBODIMENTS

Embodiments of a technique capable of reducing the amount of a refrigerant to be used while improving the cooling efficiency for a high-heat generation portion will be described with reference to the drawings.

First Embodiment

First, a first embodiment of the technology disclosed in the present application will be described.

Figure 1:
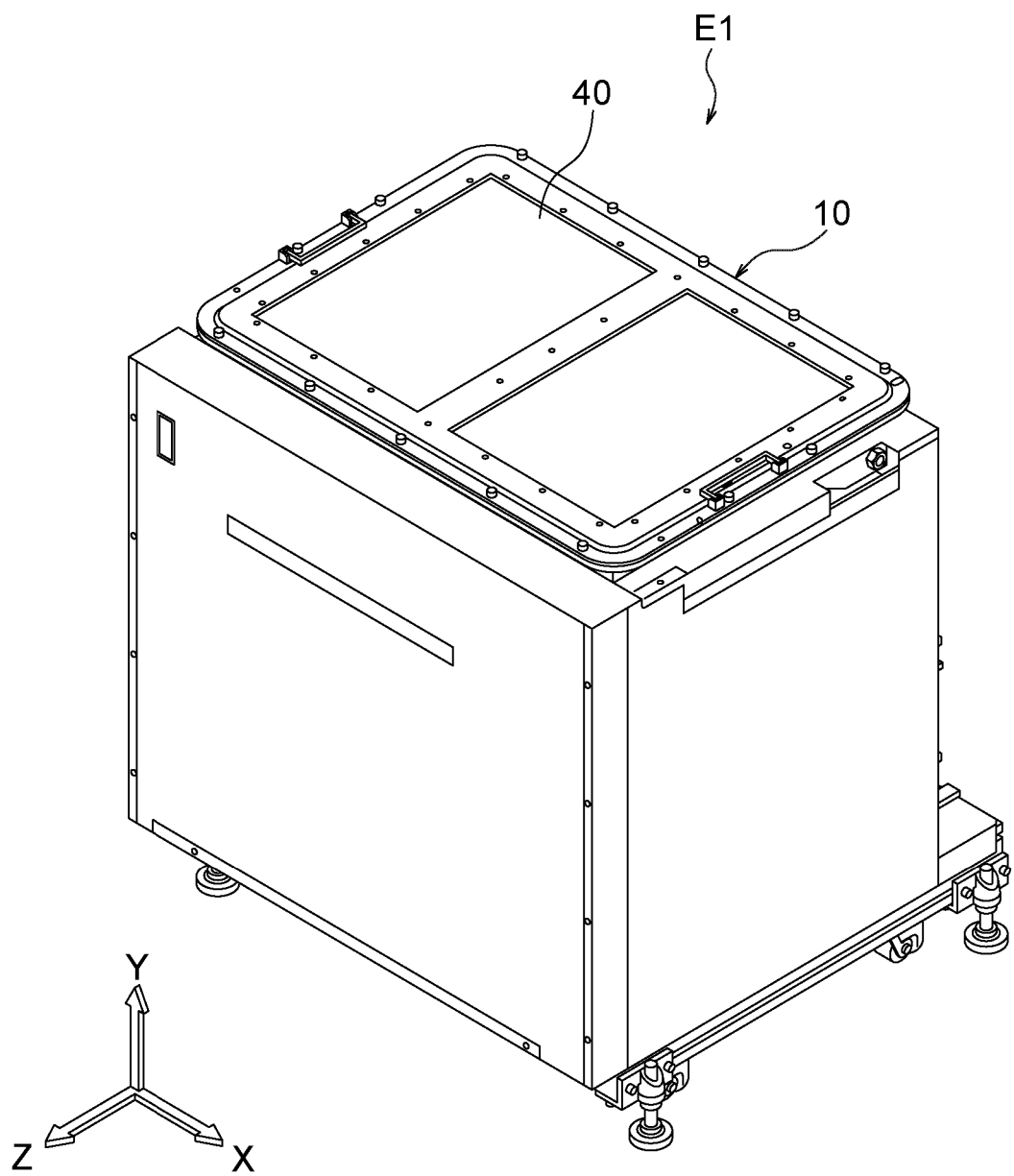
FIG. 1 is a perspective view of an electronic apparatus according to a first embodiment.
Figure 2:
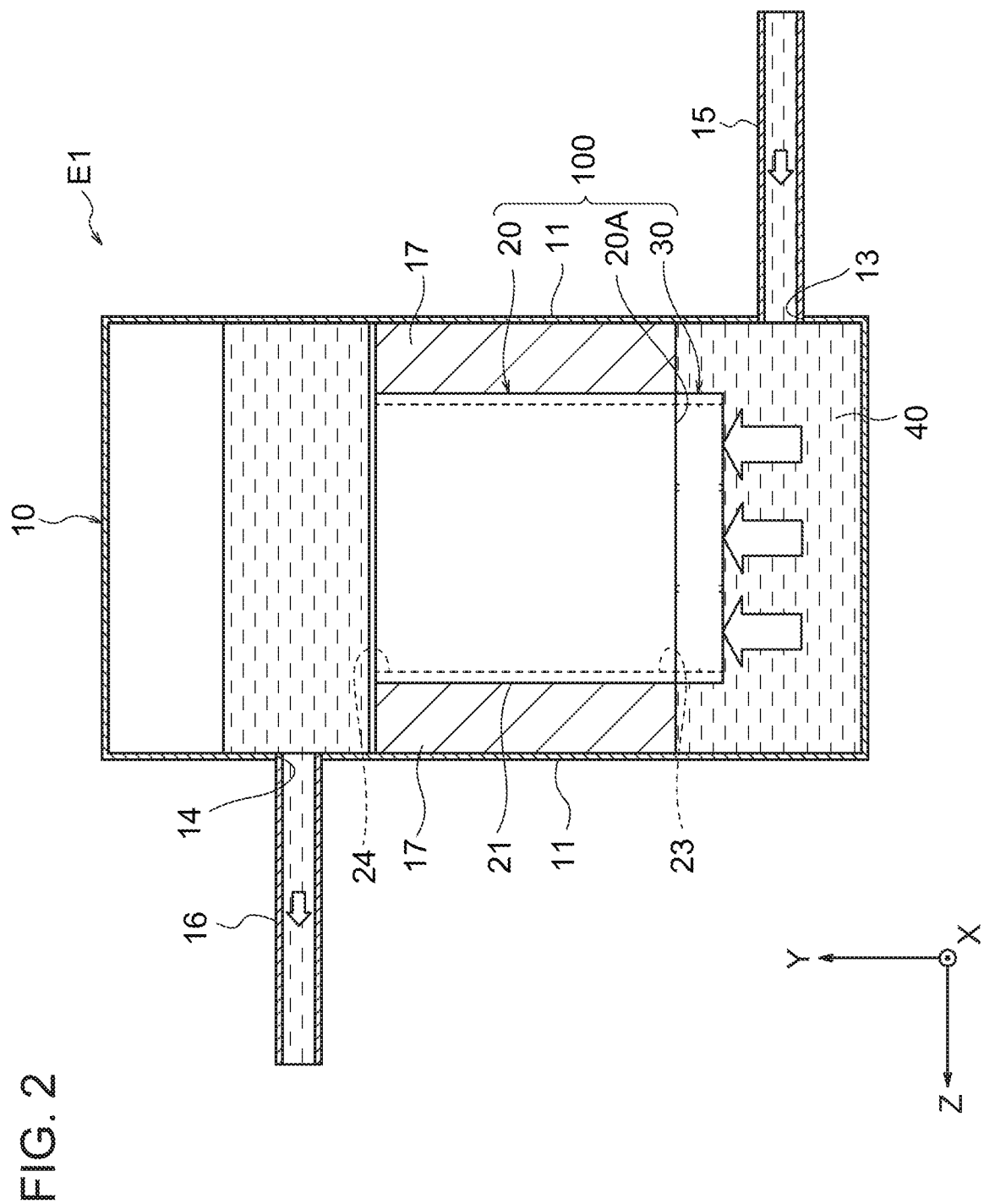
FIG. 2 is a side sectional view of the electronic apparatus of FIG. 1.

As illustrated in FIG. 2 (also appropriately refer to FIG. 1), an electronic apparatus (a cooling apparatus) E1 according to the first embodiment includes an immersion tank 10, an electronic device 20, and a block 30. A refrigerant 40 is stored in the immersion tank 10, and the electronic device 20 is immersed in the refrigerant 40. For the refrigerant 40 (refrigerant liquid), for example, a fluorinated inert liquid or oil is used as a liquid having insulating properties and high cooling efficiency.

The electronic apparatus E1 is provided with a plurality of electronic devices 20. The electronic devices 20 are accommodated in the immersion tank 10 in a state of being arrayed in a lateral width direction (X direction) of the immersion tank 10. The electronic devices 20 are detachably fixed to the immersion tank 10.

The immersion tank 10 is formed in a rectangular parallelepiped shape and has a plurality of side walls 11. A refrigerant suction port 13 configured to suck the refrigerant 40 into the immersion tank 10 is formed at a lower portion of the side wall 11 of the immersion tank 10. A refrigerant discharge port 14 configured to discharge the refrigerant 40 in the immersion tank 10 is formed at an upper portion of the side wall 11 of the immersion tank 10.

A refrigerant suction pipe 15 is connected to the refrigerant suction port 13, and a refrigerant discharge pipe 16 is connected to the refrigerant discharge port 14. A pump, a cooling device, and the like are connected between the refrigerant discharge pipe 16 and the refrigerant suction pipe 15, and the refrigerant 40 circulates between the immersion tank 10 and a cooling device.

Figure 3:
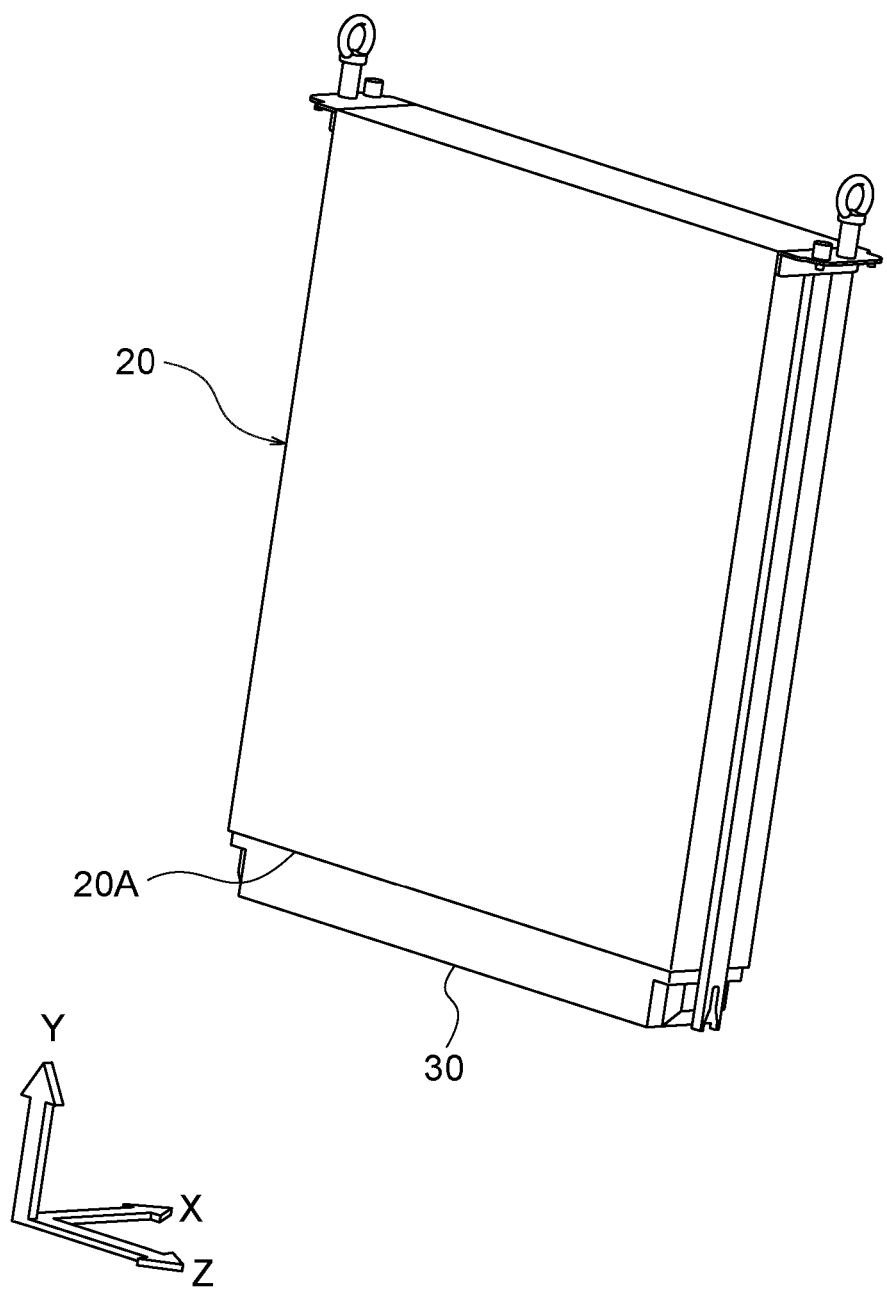
FIG. 3 is a perspective view of an electronic device with a block of FIG. 2.
Figure 4:
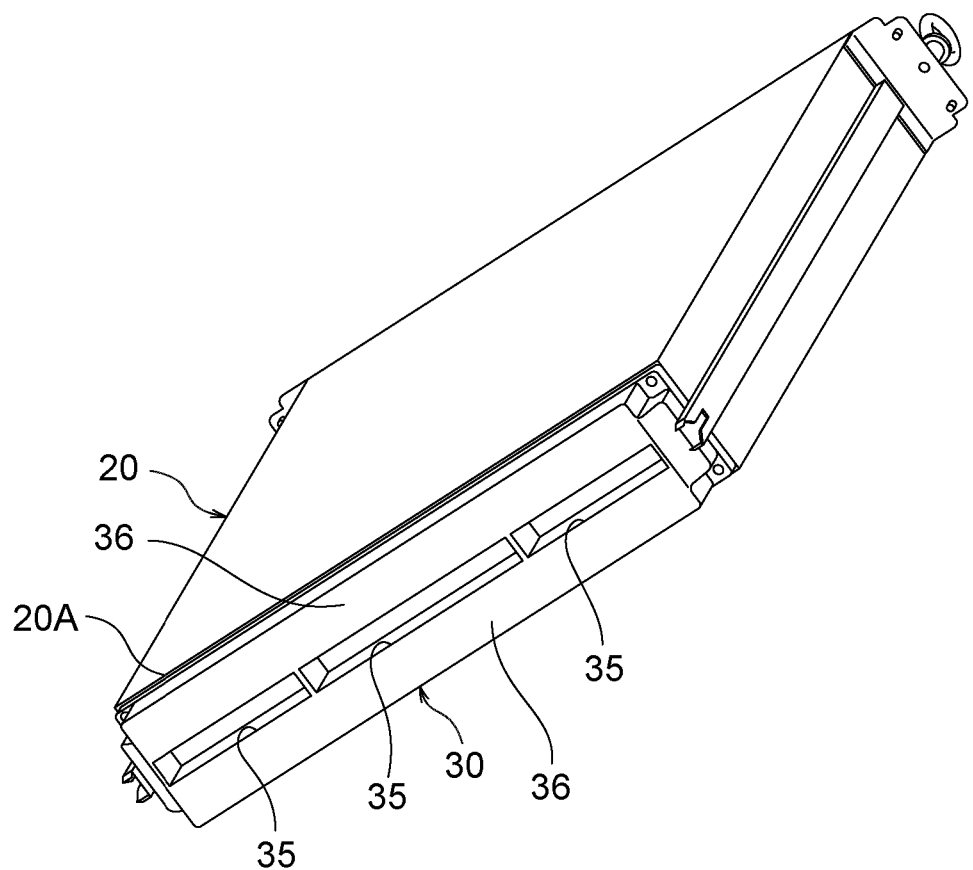
FIG. 4 is a perspective view of the electronic device with the block of FIG. 3 when viewed from a direction different from that in FIG. 3.

The electronic device 20 is formed in a thin rectangular parallelepiped shape (refer to also FIGS. 3 and 4). The electronic device 20 is vertically accommodated in the immersion tank 10. Fixed portions 17 are respectively provided on inner wall surfaces of a pair of opposed side walls 11 of the immersion tank 10, and the electronic device 20 is fixed to the fixed portion 17. The block 30 is fixed at a lower surface 20A of the electronic device 20 (refer to also FIG. 5). The electronic device 20 and the block 30 form an insertion unit 100 (refer to FIG. 2) that is to be integrally inserted into the immersion tank 10.

Figure 6:
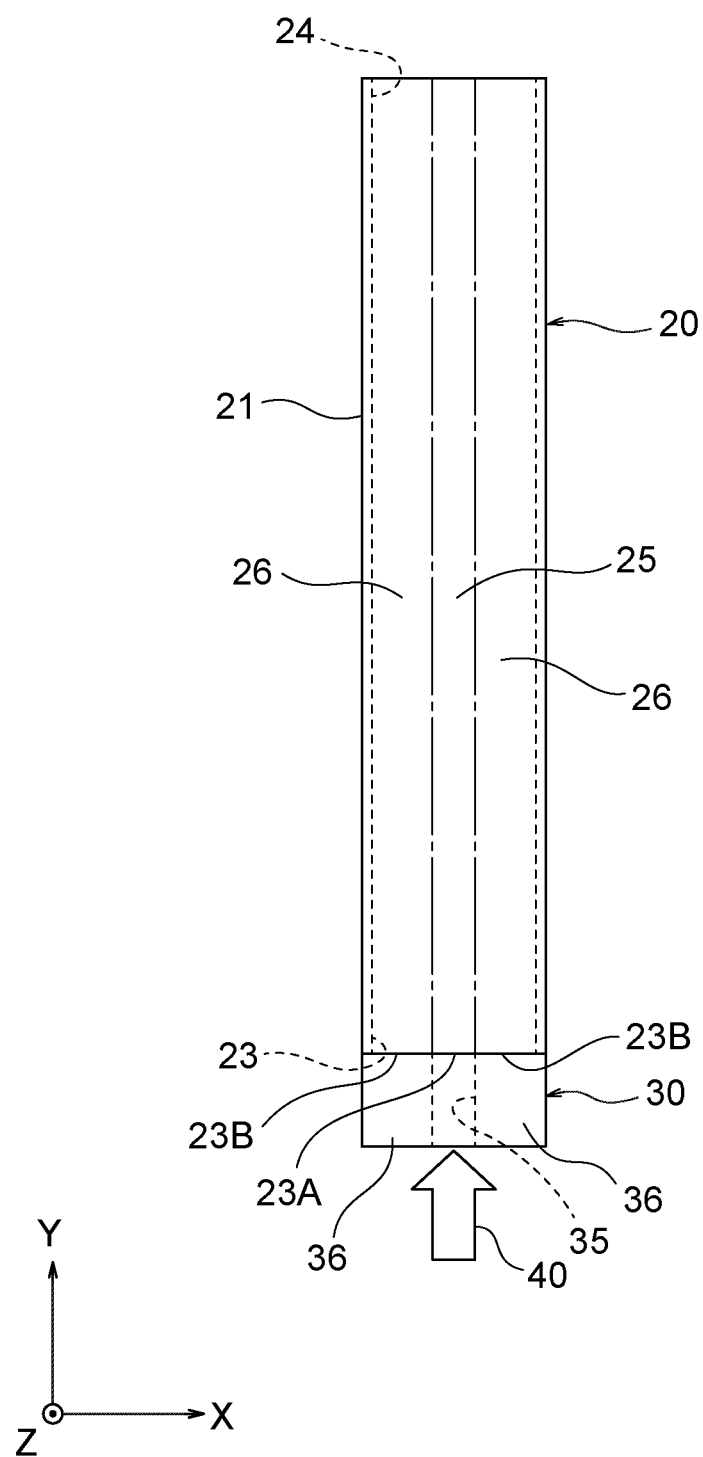
FIG. 6 is a front view illustrating an aspect in which a refrigerant is supplied to the inside of the electronic device with the block of FIG. 3.

As illustrated in FIG. 6, the electronic device 20 has a housing 21. The housing 21 is formed in a box-like tubular shape penetrating the electronic device 20 in an up-down direction. That is, a refrigerant inlet 23 is formed on the lower surface of the housing 21, and a refrigerant outlet 24 is formed on the upper surface of the housing 21.

A high-heat generation portion 25 and a low-heat generation portion 26 having a heat generation amount smaller than that of the high-heat generation portion 25 are formed inside the electronic device 20. The high-heat generation portion 25 is an example of the "first heat generation portion", and the low-heat generation portion 26 is an example of the "second heat generation portion". A substrate having a heating element is accommodated in the electronic device 20. For example, a portion close to the substrate corresponds to the high-heat generation portion 25, and a portion far from the substrate or a portion having a heating element that has a heat generation amount smaller than that of the substrate corresponds to the low-heat generation portion 26.

The high-heat generation portion 25 and the low-heat generation portion 26 are arranged side by side in a horizontal direction (X direction in FIG. 2) of the immersion tank 10. In the embodiment, as an example, the low-heat generation portions 26 are positioned on both sides in a thickness direction (X direction) of the electronic device 20, and the high-heat generation portion 25 is positioned between the low-heat generation portions 26. The refrigerant inlet 23 is located below the high-heat generation portion 25 and the low-heat generation portion 26 and is open downwardly. The refrigerant outlet 24 is located above the high-heat generation portion 25 and the low-heat generation portion 26 and is open upwardly.

As illustrated in FIGS. 3 and 4, the block 30 is formed in a rectangular parallelepiped shape having substantially the same plane area as that of the lower surface 20A of the electronic device 20 (the lower surface of the housing 21). The block 30 is fixed to the lower surface 20A of the electronic device 20. As illustrated in FIG. 2, the block 30 is located above the refrigerant suction port 13. The block 30 is made of resin or the like.

As illustrated in FIG. 6, the block 30 has a through-hole 35 that penetrates the block 30 in the up-down direction (Y direction). The through-hole 35 is formed at a central portion of the block 30 in a depth direction (X direction), and is positioned below (directly below) the high-heat generation portion 25. The through-hole 35 is positioned below the high-heat generation portion 25, and thereby a region 23A of the refrigerant inlet 23, which is positioned below the high-heat generation portion 25 is open.

By arranging the through-hole 35 below the high-heat generation portion 25, the refrigerant 40 that is sucked through the refrigerant suction port 13 (refer to FIG. 2) is guided to the high-heat generation portion 25 by the through-hole 35. In the first embodiment, the cross-sectional shape of the through-hole 35 is a quadrangular shape, but various shapes such as a circular shape and an elliptical shape may be adopted.

Both sides of the through-hole 35 in the depth direction (X direction) of the block 30 are formed as closing portions 36, respectively. Each closing portion 36 is positioned below (directly below) the low-heat generation portion 26. The closing portion 36 is positioned below the low-heat generation portion 26, thereby closing a region 23B of the refrigerant inlet 23, which is positioned below the low-heat generation portion 26. By arranging the closing portion 36 below the low-heat generation portion 26, it is possible to restrict the flowing of the refrigerant 40 sucked through the refrigerant suction port 13 (refer to FIG. 2) into the low-heat generation portion 26 by the closing portion 36.

Figure 5:
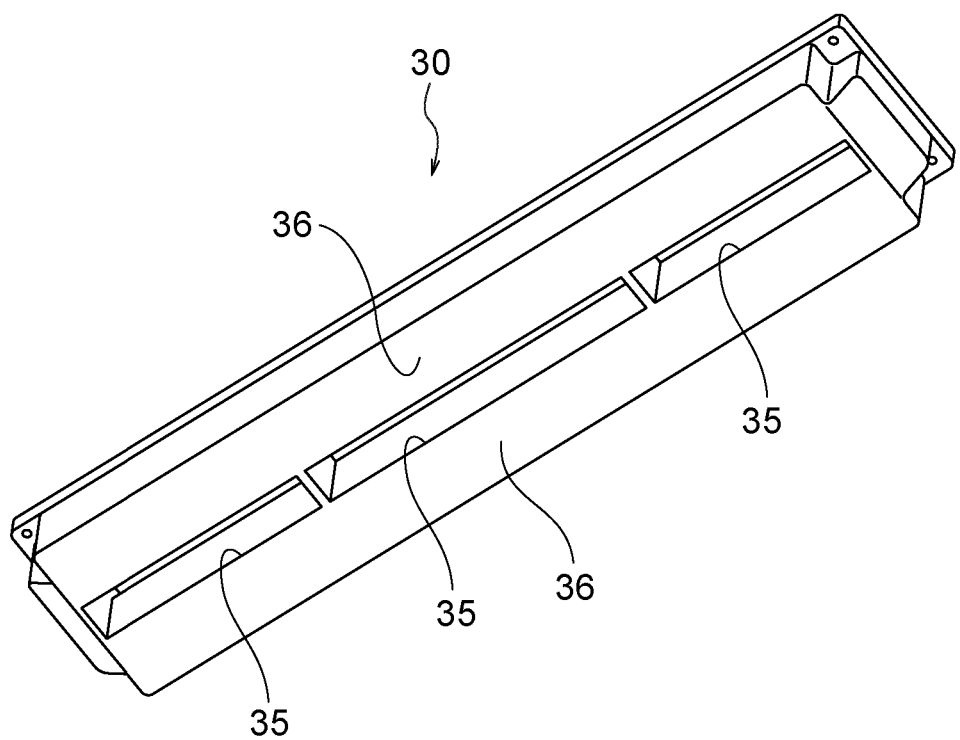
FIG. 5 is a perspective view of the block of FIG. 3.

The high-heat generation portion 25 and the low-heat generation portion 26 are formed in the lateral width direction (Z direction) of the electronic device 20. Correspondingly, as illustrated in FIG. 5, the through-hole 35 and the closing portion 36 are also formed in the lateral width direction (Z direction) of the block 30.

Next, operations and effects of the first embodiment will be described.

As described in detail above, in the electronic apparatus E1 according to the first embodiment, the refrigerant suction port 13 is formed below the lower surface 20A of the electronic device 20, and the block 30 is fixed to the lower surface 20A of the electronic device 20. The block 30 includes the through-hole 35 for allowing the region 23A of the refrigerant inlet 23, which is positioned below the high-heat generation portion 25 to be open, and the closing portion 36 for closing the region 23B of the refrigerant inlet 23, which is positioned below the low-heat generation portion 26.

Therefore, the refrigerant 40 sucked through the refrigerant suction port 13 is guided to the high-heat generation portion 25 by the through-hole 35, but the flowing of the refrigerant 40 into the low-heat generation portion 26 is restricted by the closing portion 36. Accordingly, a flow rate of the refrigerant 40 flowing into the high-heat generation portion 25 may be increased, and the cooling efficiency for the high-heat generation portion 25 may be improved. In addition, in the electronic device 20, since a temperature of the refrigerant at the refrigerant inlet 23 is low and the temperature of the refrigerant at the refrigerant outlet 24 is high, circulation of the refrigerant may be promoted by the temperature difference.

Further, as a member for preferentially cooling the high-heat generation portion 25, the block 30 having a rectangular parallelepiped shape is used. Therefore, for example, since the volume with respect to the capacity of the immersion tank 10 may be increased compared to a case in which a plate-shaped panel is used, the amount of the refrigerant 40 to be used may be reduced. This may reduce the cost.

Further, the block 30 is fixed to the electronic device 20. Therefore, for example, even when the specification change such as a change in the position of the high-heat generation portion 25 occurs in the electronic device 20, the shape of the block 30 (the position or the size of the through-hole 35) may be changed depending on the specification change, and thus, it is possible to flexibly respond to the specification change of the electronic device 20.

Further, when the specific gravity of the block 30 is smaller than that of the refrigerant 40, the weight of the entire apparatus may be reduced.

Second Embodiment

Next, a second embodiment of the technology disclosed in the present application will be described.

Figure 7:
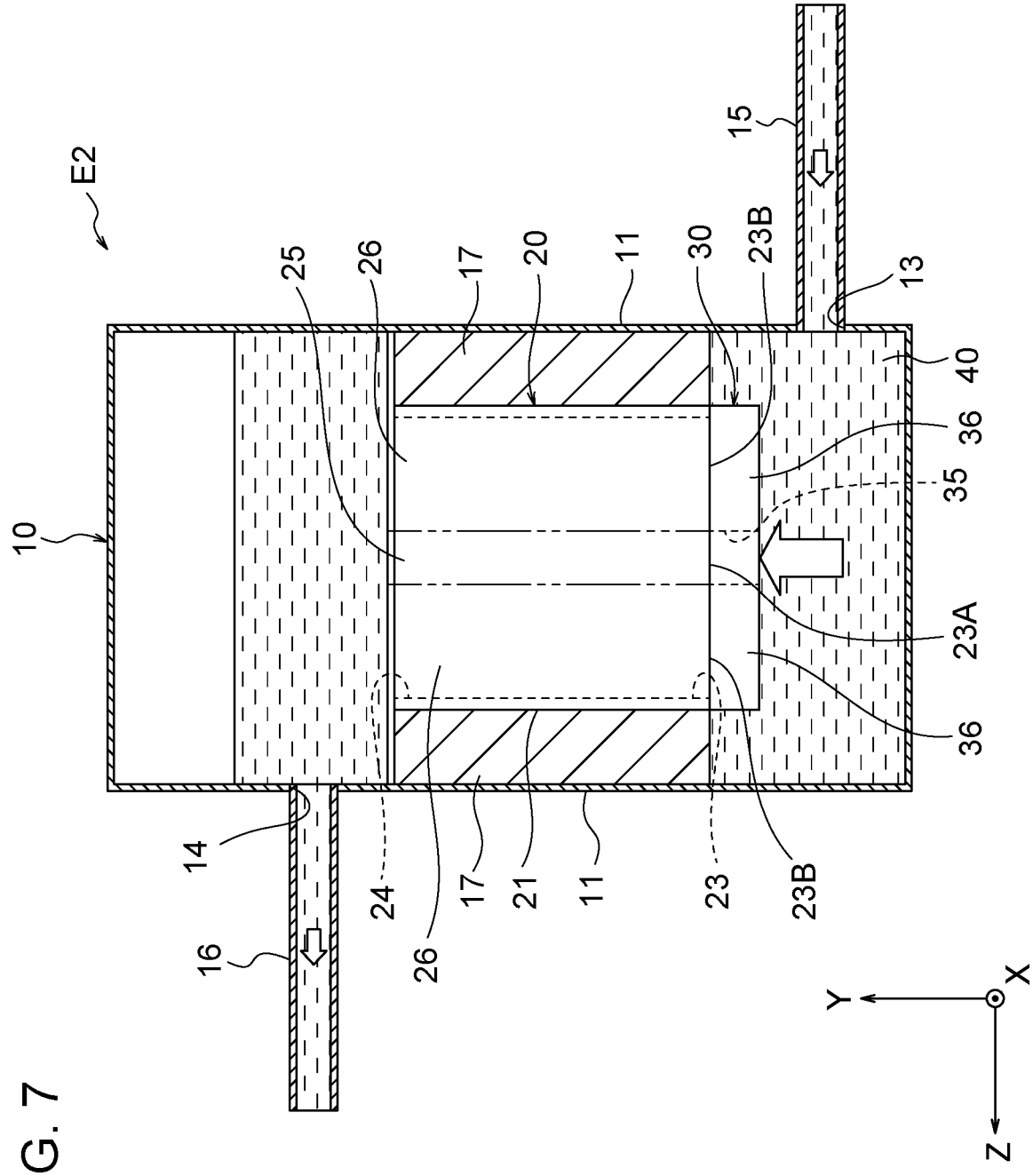
FIG. 7 is a side sectional view of an electronic apparatus according to a second embodiment.

A configuration of an electronic apparatus (a cooling apparatus) E2 according to the second embodiment illustrated in FIG. 7 is different from the configuration of the electronic apparatus E1 (refer to FIGS. 1 to 6) according to the first embodiment as follows. That is, in the electronic apparatus E2 according to the second embodiment, the low-heat generation portions 26 are positioned on both sides in the lateral width direction (Z direction) of the electronic device 20, and the high-heat generation portion 25 is positioned between the low-heat generation portions 26.

Further, the through-hole 35 is formed at the central portion of the block 30 in the lateral width direction (Z direction) (refer to also FIG. 8), and is positioned below (directly below) the high-heat generation portion 25. The through-hole 35 is positioned below the high-heat generation portion 25, and thereby a region 23A of the refrigerant inlet 23, which is positioned below the high-heat generation portion 25 is open. By arranging the through-hole 35 below the high-heat generation portion 25, the refrigerant 40 that is sucked through the refrigerant suction port 13 is guided to the high-heat generation portion 25 by the through-hole 35.

Both sides of the through-hole 35 in the lateral width direction (Z direction) of the block 30 are formed as the closing portions 36 (refer to also FIG. 8). Each closing portion 36 is positioned below (directly below) the low-heat generation portion 26. The closing portion 36 is positioned below the low-heat generation portion 26, thereby closing a region 23B of the refrigerant inlet 23, which is positioned below the low-heat generation portion 26. By arranging the closing portion 36 below the low-heat generation portion 26, it is possible to restrict the flowing of the refrigerant 40 sucked through the refrigerant suction port 13 into the low-heat generation portion 26 by the closing portion 36.

Even with such a configuration, similarly to the first embodiment, it is possible to increase the flow rate of the refrigerant 40 flowing into the high-heat generation portion 25 by restricting the flowing of the refrigerant 40 into the low-heat generation portion 26 while guiding the refrigerant 40 to the high-heat generation portion 25. As a result, the cooling efficiency for the high-heat generation portion 25 may be improved. In addition, by using the block 30 having a rectangular parallelepiped shape, it is possible to reduce the amount of the refrigerant 40 to be used, thereby reducing the cost.

Third Embodiment

Next, a third embodiment of the technology disclosed in the present application will be described.

Figure 9:
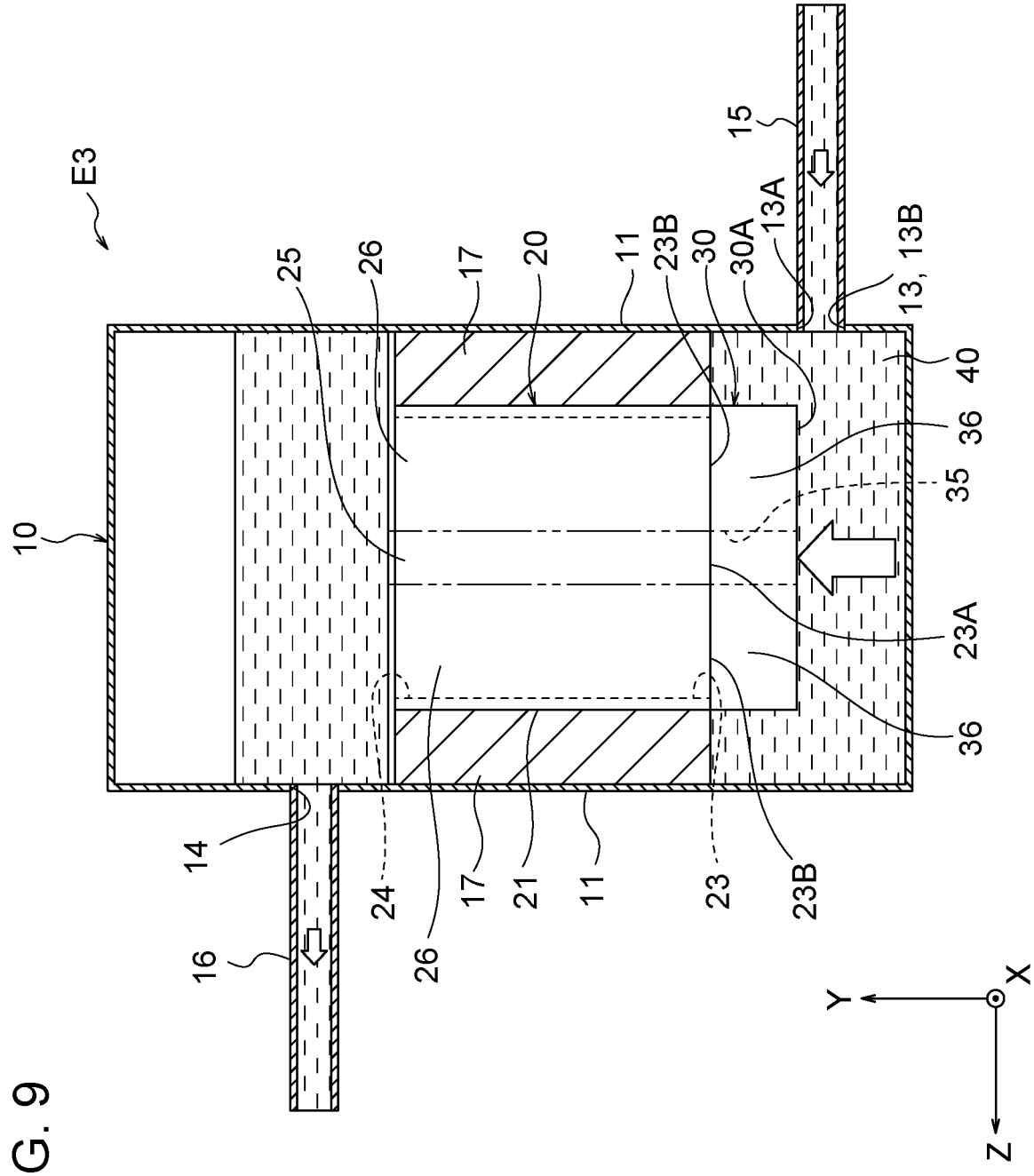
FIG. 9 is a side sectional view of an electronic apparatus according to a third embodiment.

A configuration of an electronic apparatus (a cooling apparatus) E3 according to the third embodiment illustrated in FIG. 9 is different from the configuration of the electronic apparatus E2 (refer to FIGS. 7 and 8) according to the second embodiment as follows. That is, in the electronic apparatus E3 according to the third embodiment, the block 30 is extended downward, and a lower end 30A of the block 30 is positioned at the same height as that of an upper edge 13A of the refrigerant suction port 13.

In this manner, when the lower end 30A of the block 30 is positioned at the same height as that of the upper edge 13A of the refrigerant suction port 13, the volume of the block 30 is increased while the refrigerant 40 smoothly flows into the through-hole 35 from the refrigerant suction port 13, and thus the amount of the refrigerant 40 to be used may be further reduced.

As long as the refrigerant 40 may flow into the through-hole 35 from the refrigerant suction port 13, the lower end 30A of the block 30 may be positioned at a height lower than that of the upper edge 13A of the refrigerant suction port 13 and may be positioned at a height lower than that of a lower edge 13B of the refrigerant suction port 13.

In this manner, when the lower end 30A of the block 30 is positioned at a height lower than that of the upper edge 13A of the refrigerant suction port 13, or is positioned at a height lower than that of a lower edge 13B of the refrigerant suction port 13, the volume of the block 30 is increased, and thus the amount of the refrigerant 40 to be used may be further reduced.

Fourth Embodiment

Next, a fourth embodiment of the technology disclosed in the present application will be described.

Figure 10:
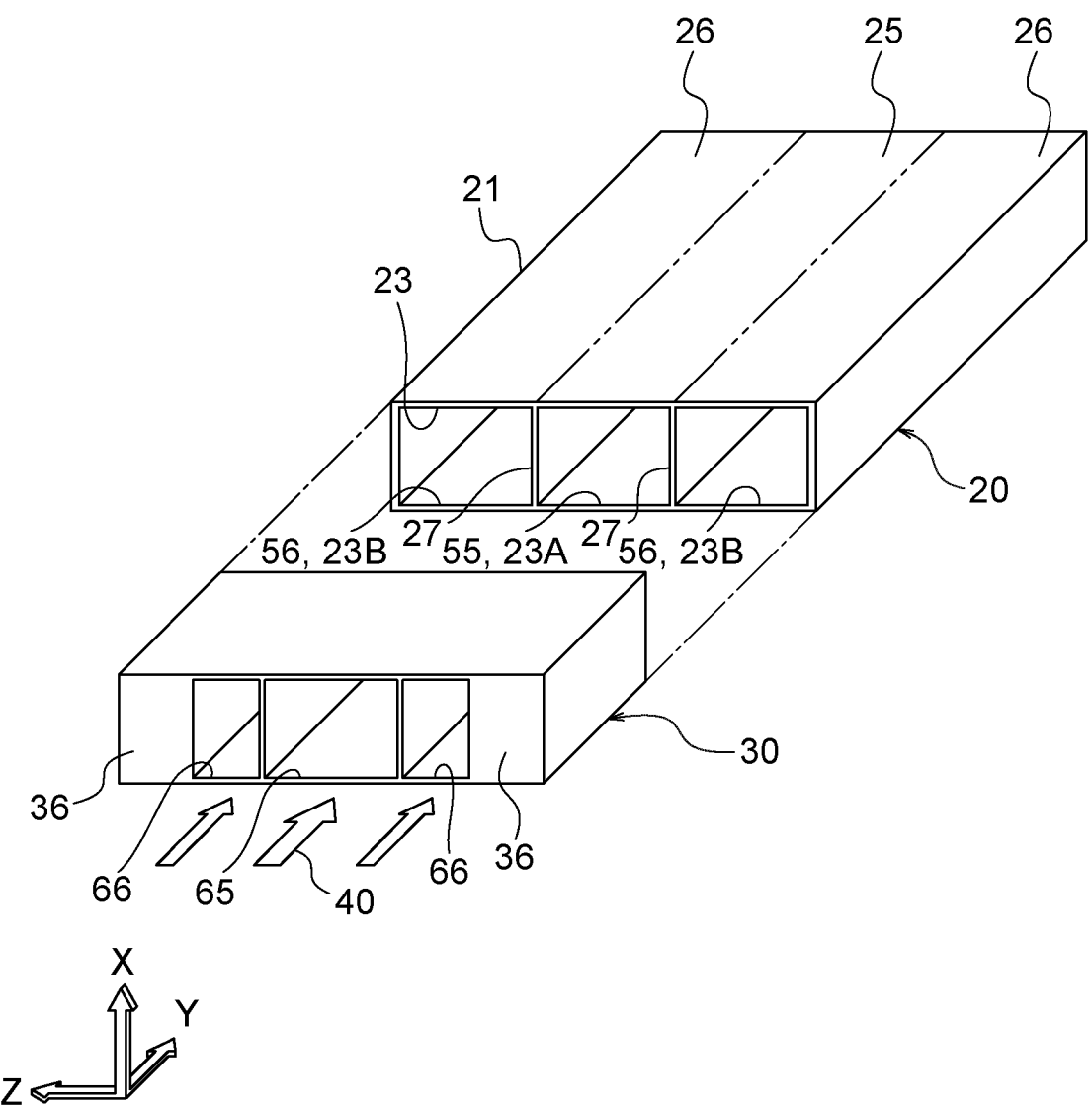
FIG. 10 is an exploded perspective view of an electronic device with a block according to a fourth embodiment.

Configurations of the electronic device 20 and the block 30 according to the fourth embodiment illustrated in FIG. 10 are different from those of the electronic apparatus E2 (refer to FIGS. 7 and 8) according to the second embodiment as follows. That is, in the fourth embodiment, a pair of partition walls 27 are provided inside the housing 21 of the electronic device 20. The pair of partition walls 27 face each other in the lateral width direction (Z direction) of the electronic device 20.

The inside of the electronic device 20 is partitioned, by the pair of partition walls 27, into the high-heat generation portion 25 and the low-heat generation portions 26 on both sides of the high-heat generation portion 25. For example, one of the low-heat generation portions 26 is a heat generation portion having a heat generation amount smaller than that of the high-heat generation portion 25, and the other of the low-heat generation portions 26 is, for example, a power supply portion.

Further, the refrigerant inlet 23 is also partitioned, by the pair of partition walls 27, into a first refrigerant inlet 55 corresponding to the high-heat generation portion 25 and second refrigerant inlets 56 corresponding to the low-heat generation portions 26. The first refrigerant inlet 55 corresponds to the region 23A located below (directly below) the high-heat generation portion 25 in the refrigerant inlet 23, and the second refrigerant inlets 56 correspond to the regions 23B located below (directly below) the low-heat generation portions 26 in the refrigerant inlet 23.

The block 30 has a first through-hole 65 communicating with the first refrigerant inlet 55 and second through-holes 66 communicating with the second refrigerant inlets 56. The first through-hole 65 is an example of the "through-hole" and has substantially the same opening area as that of the first refrigerant inlet 55. The second through-hole 66 has an opening area smaller than that of the second refrigerant inlet 56 in the lateral width direction (Z direction) of the electronic device 20, and the closing portions 36 are formed in the block 30 so as to be adjacent to the second through-holes 66, respectively. The closing portion 36 is positioned on the side opposite to the first through-hole 65 with respect to the second through-hole 66 and closes a part of the second refrigerant inlet 56.

In this manner, when the closing portion 36 closes a part of the second refrigerant inlet 56, the remaining portion (the portion that is not closed) of the second refrigerant inlet 56 is open by the second through-hole 66, and therefore the refrigerant 40 may flow into the low-heat generation portion 26 through the second through-hole 66. In this case, since the opening area of the first refrigerant inlet 55 is larger than the opening area of the second refrigerant inlet 56 in response to the fact that the high-heat generation portion 25 has a heat generation amount more than that of the low-heat generation portion 26, the amount of the refrigerant 40 flowing into the high-heat generation portion 25 is larger than the amount of the refrigerant 40 flowing into the low-heat generation portion 26. Thereby, the high-heat generation portion 25 may be efficiently cooled.

Figure 11A:
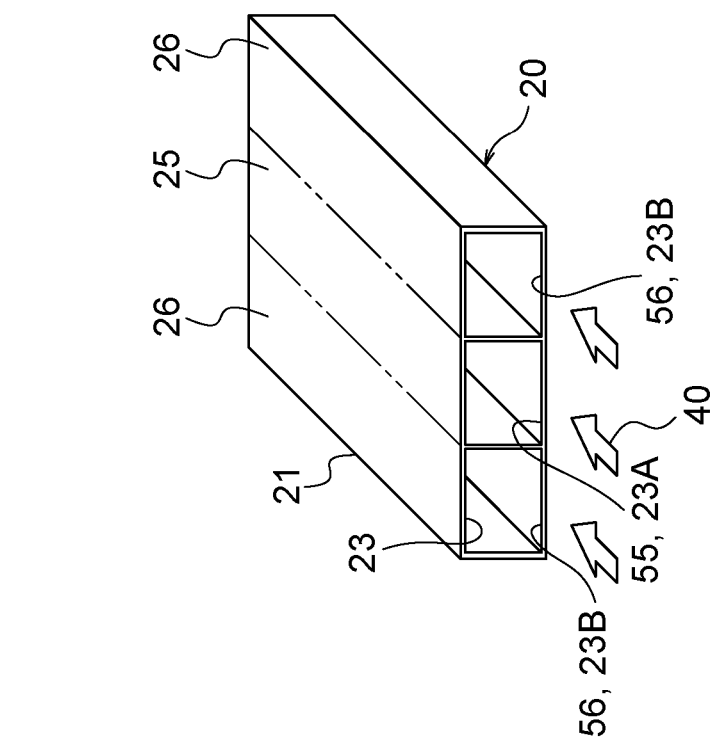
FIGS. 11A and 11B are diagrams for comparing a case where the electronic device of FIG. 10 is provided with a block and a case where the electronic device of FIG. 10 is not provided with a block.
Figure 11B:
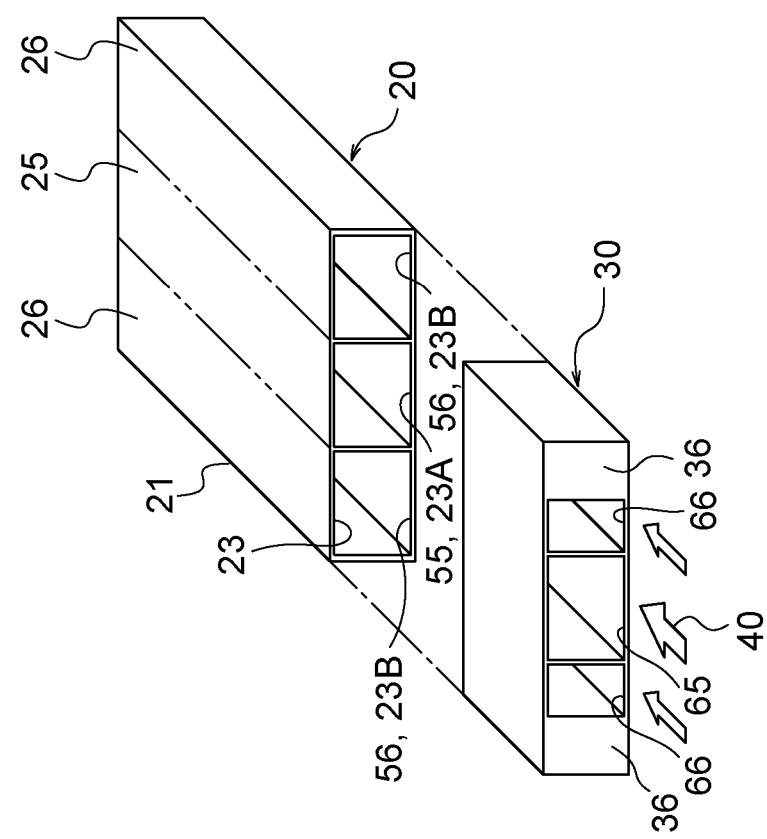

FIGS. 11A and 11B are diagrams for comparing a case where the electronic device 20 of FIG. 10 is provided with the block 30 and a case where the electronic device 20 of FIG. 10 is not provided with the block 30. In the example of FIGS. 11A and 11B, the first refrigerant inlet 55 and the second refrigerant inlet 56 have the same opening area. When the block 30 is not provided, the opening area of each of the first refrigerant inlet 55 and the second refrigerant inlets 56 is set as S, and the flow rate of the refrigerant 40 flowing into each of the high-heat generation portion 25 and the low-heat generation portions 26 is set as Q. Further, it is assumed that the sectional area ratio (closing rate) of the closing portion 36 is α. The sectional area ratio α of the closing portion 36 is a ratio obtained by setting the opening area of the second refrigerant inlet 56 of when the closing portion 36 is not provided, as 1.

When a part of the pair of second refrigerant inlets 56 is closed by the closing portions 36, the effective opening area of each of the pair of second refrigerant inlets 56 is (1−α)×S. Further, the flow rate of the refrigerant 40 flowing into each of the pair of low-heat generation portions 26 is (1−α)×Q, and the flow rate of the refrigerant 40 flowing into the high-heat generation portion 25 is (1+2α)×Q.

Figure 12:
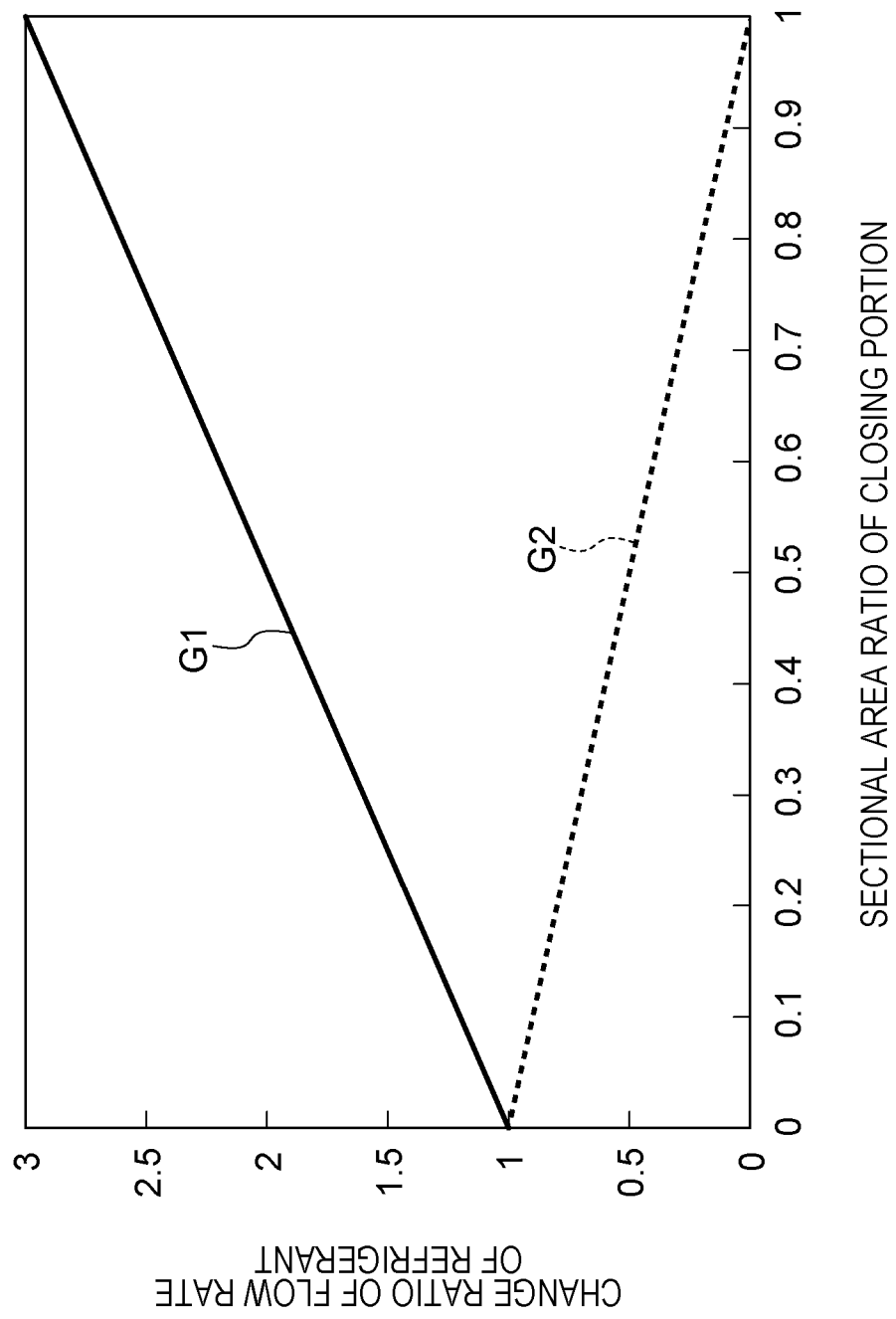
FIG. 12 is a graph illustrating a relationship between a change ratio of a flow rate of a refrigerant and a sectional area ratio of a closing portion of FIG. 11A.

FIG. 12 is a graph illustrating a change ratio of the flow rate of the refrigerant 40 and a sectional area ratio of the closing portion 36 of FIG. 11A. The change ratio of the flow rate of the refrigerant 40 is a ratio obtained by setting the flow rate of the refrigerant 40 flowing into each of the high-heat generation portion 25 and the low-heat generation portions 26 of when the closing portion 36 is not provided, as 1. The graph G1 is a graph regarding the high-heat generation portion 25, and the graph G2 is a graph regarding the low-heat generation portion 26.

As illustrated in FIG. 12, as the sectional area ratio α of the closing portion 36 increases, the flow rate of the refrigerant 40 flowing into the high-heat generation portion 25 increases, and when 50% of the pair of second refrigerant inlets 56 is blocked by the closing portions 36, the flow rate of the refrigerant 40 flowing into the high-heat generation portion 25 is doubled. As described above, by changing the sectional area ratio α of the closing portion 36, it is possible to adjust the proportion of the flow rates of the refrigerant 40 flowing into the high-heat generation portion 25 and the low-heat generation portions 26, respectively.

In the fourth embodiment, the heat generation amounts of the pair of low-heat generation portions 26 may be different from each other. That is, since the pair of low-heat generation portions 26 correspond to an intermediate-heat generation portion and the low-heat generation portion, the electronic device 20 may have a high-heat generation portion, an intermediate-heat generation portion, and a low-heat generation portion. In addition, the sectional area ratios α of the pair of closing portions 36 may be different in response to the fact that the heat generation amounts of the pair of low-heat generation portions 26 are different.

Fifth Embodiment

Next, a fifth embodiment of the technology disclosed in the present application will be described.

Figure 13:
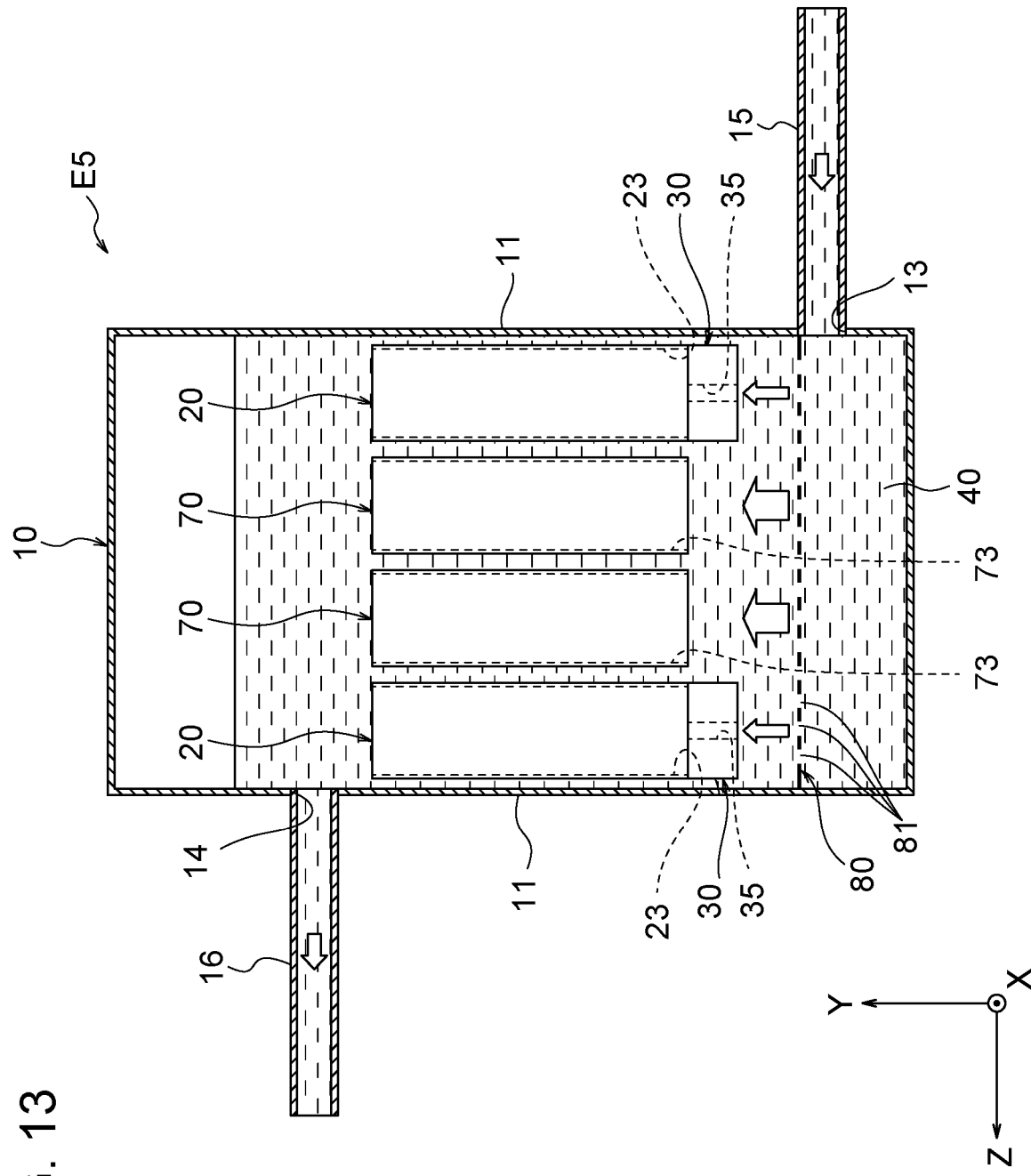
FIG. 13 is a side sectional view of an electronic apparatus according to a fifth embodiment.

A configuration of an electronic apparatus (a cooling apparatus) E5 according to the fifth embodiment illustrated in FIG. 13 is different from the configuration of the electronic apparatus E1 (refer to FIGS. 1 to 6) according to the first embodiment as follows. That is, in the electronic apparatus E5 according to the fifth embodiment, a plurality of electronic devices 20 and 70 are arranged in the depth direction (Z direction) of the immersion tank 10. Each of the electronic devices 20 and 70 is immersed in the refrigerant 40 by being accommodated in the immersion tank 10.

The two electronic devices 70 in the center are examples of the "first electronic device". The two electronic devices 70 in the center are high-heat generation electronic devices, and are not provided with the block 30. That is, the electronic device 70 has a refrigerant inlet 73 that is open downward, and the entire refrigerant inlet 73 is open downward.

On the other hand, the two electronic devices 20 that are on both sides are examples of the "second electronic device". The two electronic devices 20 on both sides are low-heat generation electronic devices and are provided with the block 30. The configurations of the low-heat generation electronic device 20 and the block 30 are the same as those of the first embodiment. The heat generation amount of the low-heat generation electronic device 20 is generally smaller than that of the high-heat generation electronic device 70.

Figure 14:
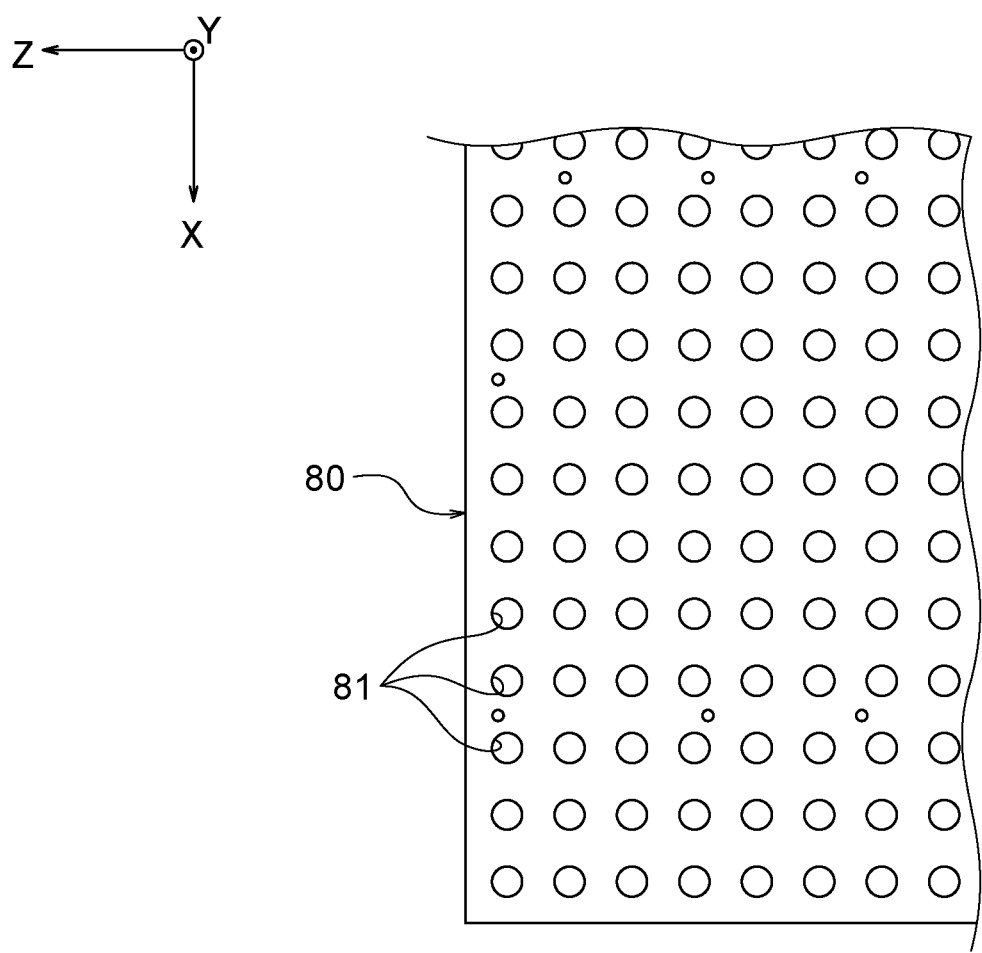
FIG. 14 is a plan view of a panel used in the electronic apparatus of FIG. 13.

Further, in the electronic apparatus E5 according to the fifth embodiment, a panel 80 is disposed between the block 30 and the refrigerant suction port 13. The panel 80 is disposed such that the up-down direction of the immersion tank 10 becomes the thickness direction of the panel 80, and the panel 80 is integrally incorporated in the immersion tank 10. As illustrated in FIG. 14, The panel 80 has a plurality of straightening holes 81 penetrating the panel 80 in the up-down direction of the immersion tank 10. Various shapes such as a quadrilateral shape, a circular shape, and an elliptical shape may be adopted as the cross-sectional shape of the straightening hole 81.

In this manner, in a case where the panel 80 is disposed between the block 30 and the refrigerant suction port 13, the directionality of the horizontal flow of the refrigerant 40 sucked from the refrigerant suction port 13 may be reduced. Further, by discharging the refrigerant 40 upward through the fine straightening holes 81, the amount of the refrigerant 40 supplied to the electronic devices 20 may be made uniform. Then, with the direction and the flow rate of the refrigerant 40 being made uniform, the flow rate of the refrigerant 40 supplied to the high-heat generation electronic device 70 and the low-heat generation electronic device 20 may be adjusted by the block 30. The gap between the electronic devices 20 is very small, and there is hardly any refrigerant flowing through the gap.

FIGS. 15A and 15B are diagrams for comparing a case where the electronic apparatus E5 of FIG. 13 is provided with the block 30 and a case where the electronic apparatus E5 of FIG. 13 is not provided with the block 30. In the example of FIGS. 15A and 15B, the refrigerant inlet 73 of the high-heat generation electronic device 70 and the refrigerant inlet 23 of the low-heat generation electronic device 20 have the same opening area. When the block 30 is not provided, the opening area of the refrigerant inlet 23 is set as S, and the flow rate of the refrigerant 40 flowing into each of the high-heat generation electronic devices 70 and the low-heat generation electronic devices 20 is set as Q. Further, it is assumed that the sectional area ratio (closing rate) of the block 30 is $\beta$. The sectional area ratio $\beta$ of the block 30 is a ratio obtained by setting the opening area of the refrigerant inlet 23 of when the block 30 is not provided, as 1.

When a part of the refrigerant inlets 23 of the two low-heat generation electronic devices 20 is closed by the block 30, the effective opening area of each of the refrigerant inlets 23 becomes $(1-\beta) \times S$. Further, the flow rate of the refrigerant 40 flowing into each of the two low-heat generation electronic devices 20 is $(1-\beta) \times Q$, and the flow rate of the refrigerant 40 flowing into each of the two high-heat generation electronic devices 70 is $(1+\beta) \times Q$.

Figure 16:
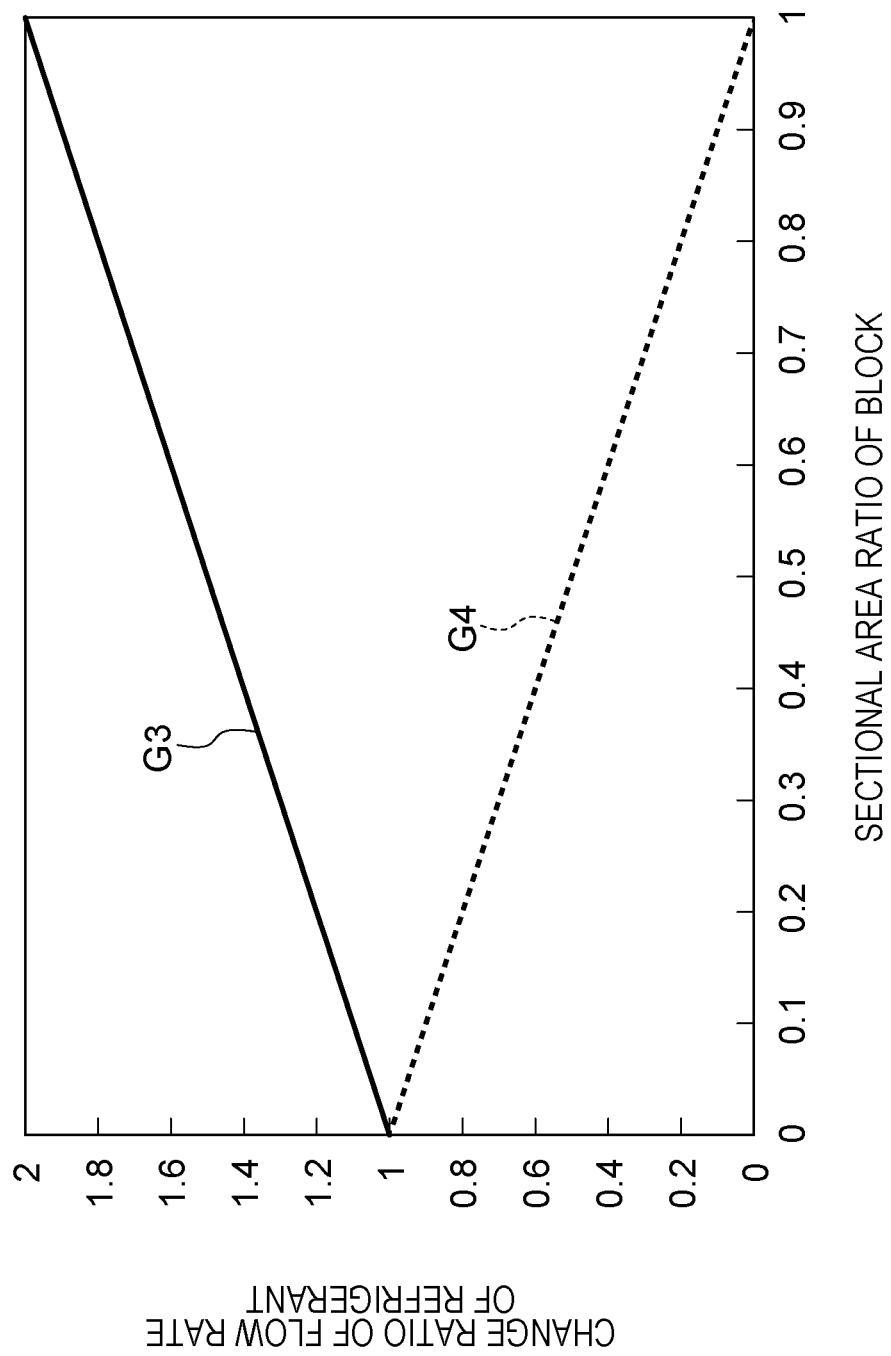
FIG. 16 is a graph illustrating a relationship between a change ratio of a flow rate of a refrigerant and a sectional area ratio of the block of FIG. 15A.

FIG. 16 is a graph illustrating a change ratio of the flow rate of the refrigerant 40 and a sectional area ratio of the block 30 of FIG. 15A. The change ratio of the flow rate of the refrigerant 40 is a ratio obtained by setting the flow rate of the refrigerant 40 flowing into each of the high-heat generation electronic devices 70 and the low-heat generation electronic devices 20 of when the block 30 is not provided, as 1. The graph G3 is a graph regarding the high-heat generation electronic device 70, and the graph G4 is a graph regarding the low-heat generation electronic device 20.

As illustrated in FIG. 16, as the sectional area ratio $\beta$ of the block 30 increases, the flow rate of the refrigerant 40 flowing into the high-heat generation electronic device 70 increases. As described above, by changing the sectional area ratio $\beta$ of the block 30, it is possible to adjust the proportion of the flow rates of the refrigerant 40 flowing into the high-heat generation electronic devices 70 and the low-heat generation electronic devices 20, respectively.

Figure 17:
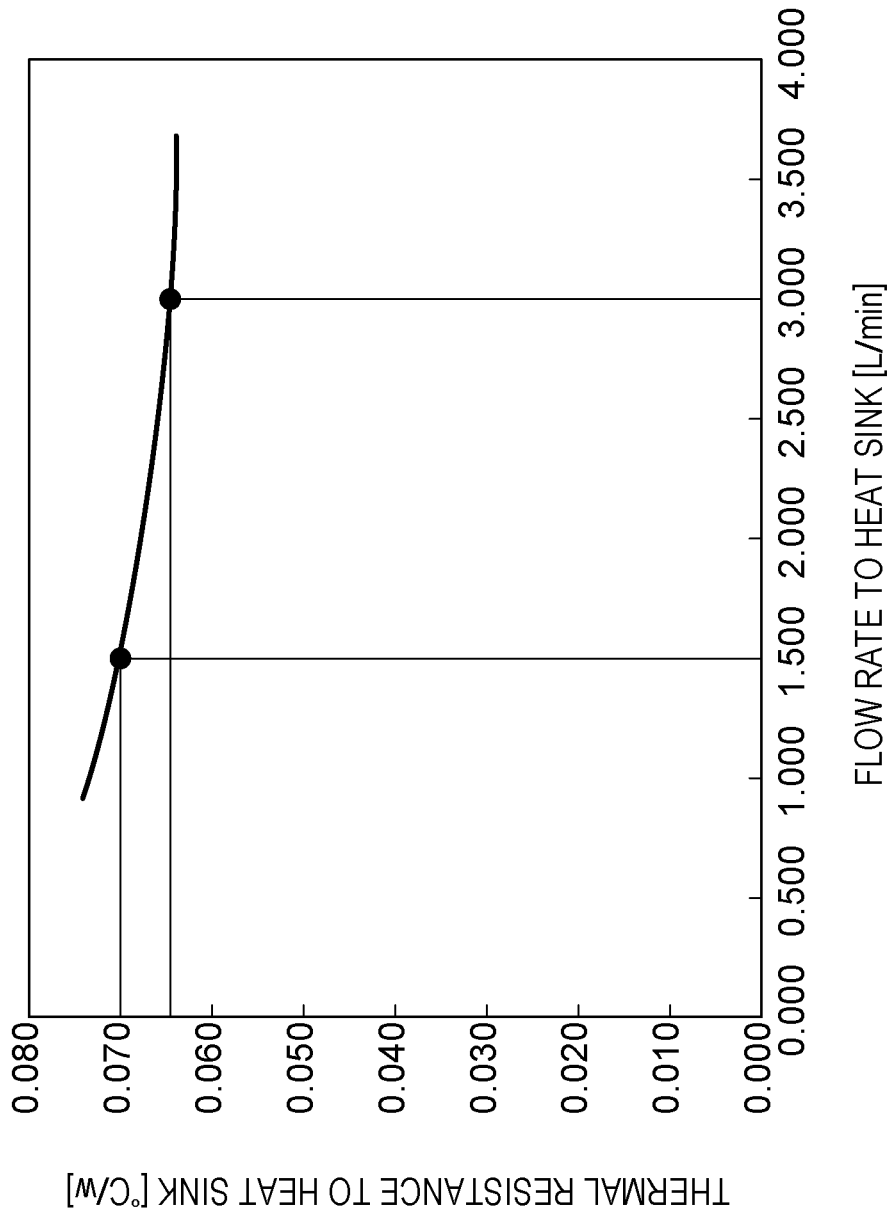
FIG. 17 is a graph illustrating an example of a result of analyzing a correlation between a flow rate to a heat sink (including a heating element) and a thermal resistance to the heat sink when an electrically insulating refrigerant is used.

FIG. 17 illustrates an example of a result of analyzing a correlation between a flow rate to a heat sink (including a heating element) and a thermal resistance to the heat sink when an electrically insulating refrigerant is used. The heat sink is disposed on a substrate provided inside the electronic device 20. In the example of FIG. 17, when the flow rate of the refrigerant 40 is doubled, the thermal resistance is reduced by 8%, for example. That is, the cooling capacity may be improved by reducing the thermal resistance.

Furthermore, in the case of using a structure in which two heating elements are arranged, the heating element in the subsequent stage is affected by the exhaust heat of the heating element in the preceding stage. An inflow temperature T2in of the heating element of the subsequent stage is expressed by Expression (1) below in a case of an inflow temperature T1in of the heating element of the preceding stage.

$$T2in = T1in + P/(\rho \times Cp \times Q) \tag{1}$$

(P: the heat generation amount of the heating element of the preceding stage [W], $\rho$: the density of the refrigerant [kg/m$^3$], Cp: the specific heat of the refrigerant [L/kgK], Q: the flow rate of the refrigerant [m$^3$/s])

From Equation (1) above, it may be seen that when the flow rate of the refrigerant 40 is doubled, the temperature increase of the inflow temperature T2in becomes ½, and the temperature of the heating element may be lowered. That is, it is possible to lower the pump flow rate, and it is possible to reduce the operation cost (electricity bill) by reducing power consumption.

In the fifth embodiment, the heat generation amounts of the pair of high-heat generation electronic devices 70 may be different from each other. Similarly, the heat generation amounts of the pair of low-heat generation electronic devices 20 may be different from each other. That is, the electronic apparatus E5 may include a plurality of electronic devices 20 and 70 having different heat generation amounts. In addition, the sectional area ratios $\beta$ of the pair of blocks 30 may be different in response to the fact that the electronic apparatus E5 includes a plurality of electronic devices 20 and 70 having different heat generation amounts.

Further, the electronic apparatus E5 includes four electronic devices 20 and 70, but may include five or more electronic devices 20 and 70.

Sixth Embodiment

Next, a sixth embodiment of the technology disclosed in the present application will be described.

Figure 18:
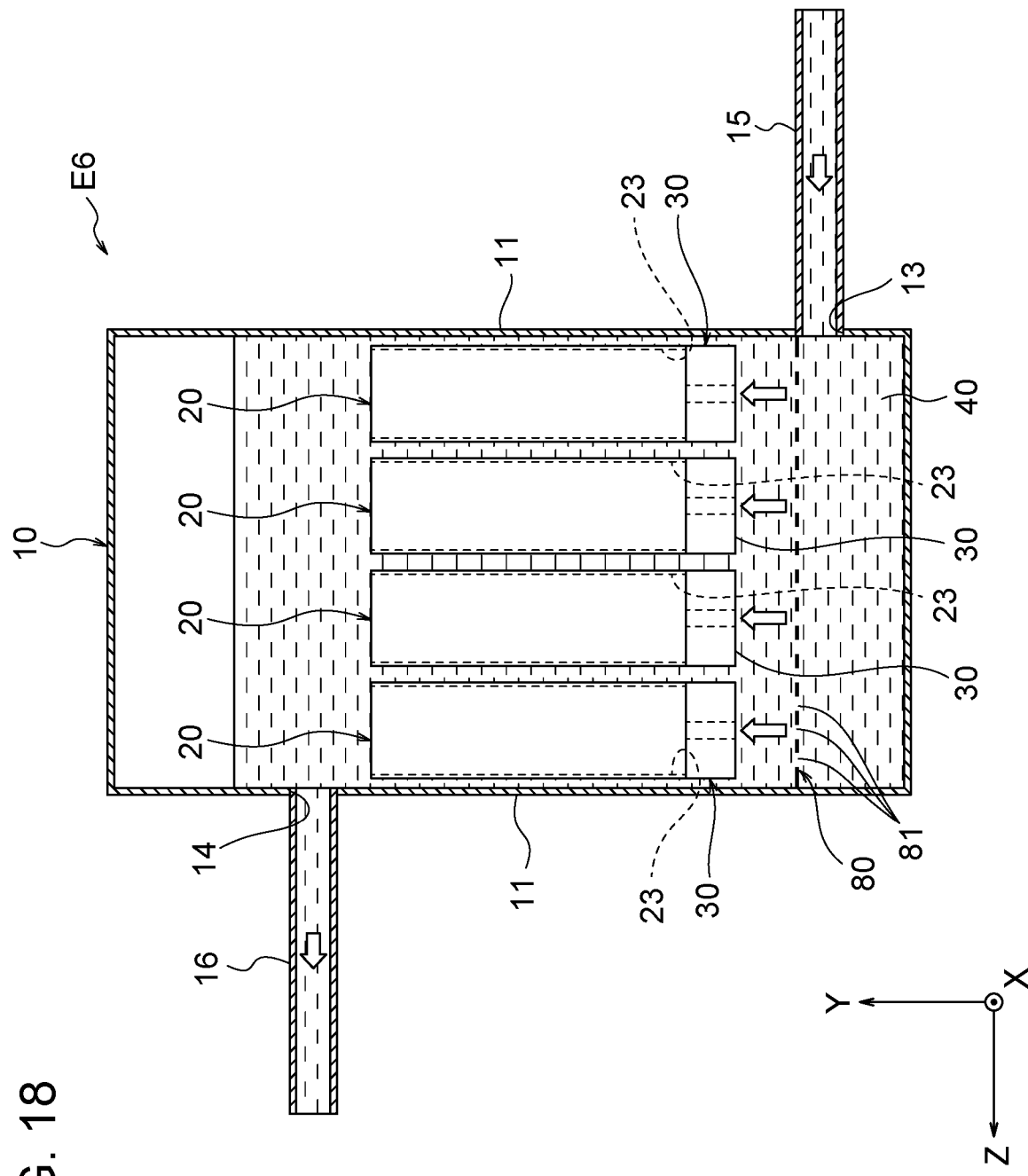
FIG. 18 is a side sectional view of an electronic apparatus according to a sixth embodiment.

A configuration of an electronic apparatus (a cooling apparatus) E6 according to the sixth embodiment illustrated in FIG. 18 is different from the configuration of the electronic apparatus E5 (refer to FIGS. 13 to 17) according to the fifth embodiment as follows. That is, in the electronic apparatus E6 according to the sixth embodiment, only the electronic device 20 provided with a block is used. Also in the electronic apparatus E6 according to the sixth embodiment, the panel 80 is disposed between the block 30 and the refrigerant suction port 13. The panel 80 has the straightening holes 81 penetrating the panel 80 in the up-down direction of the immersion tank 10.

In this manner, in a case where the panel 80 is disposed between the block 30 and the refrigerant suction port 13, the directionality of the horizontal flow of the refrigerant 40 sucked from the refrigerant suction port 13 may be reduced. Further, by discharging the refrigerant 40 upward through the fine straightening holes 81, the amount of the refrigerant 40 supplied to the electronic devices 20 may be made uniform. Then, with the direction and the flow rate of the refrigerant 40 being made uniform, the flow rate of the refrigerant 40 flowing into the high-heat generation portion 25 of each electronic device 20 may be adjusted by the block 30.

In a case where the heat generation amounts of the high-heat generation portions 25 are different in the electronic devices 20, the opening areas of the through-holes 35 in the blocks 30 may be made different depending on the heat generation amount of each high-heat generation portion 25.

Seventh Embodiment

Next, a seventh embodiment of the technology disclosed in the present application will be described.

Figure 19:
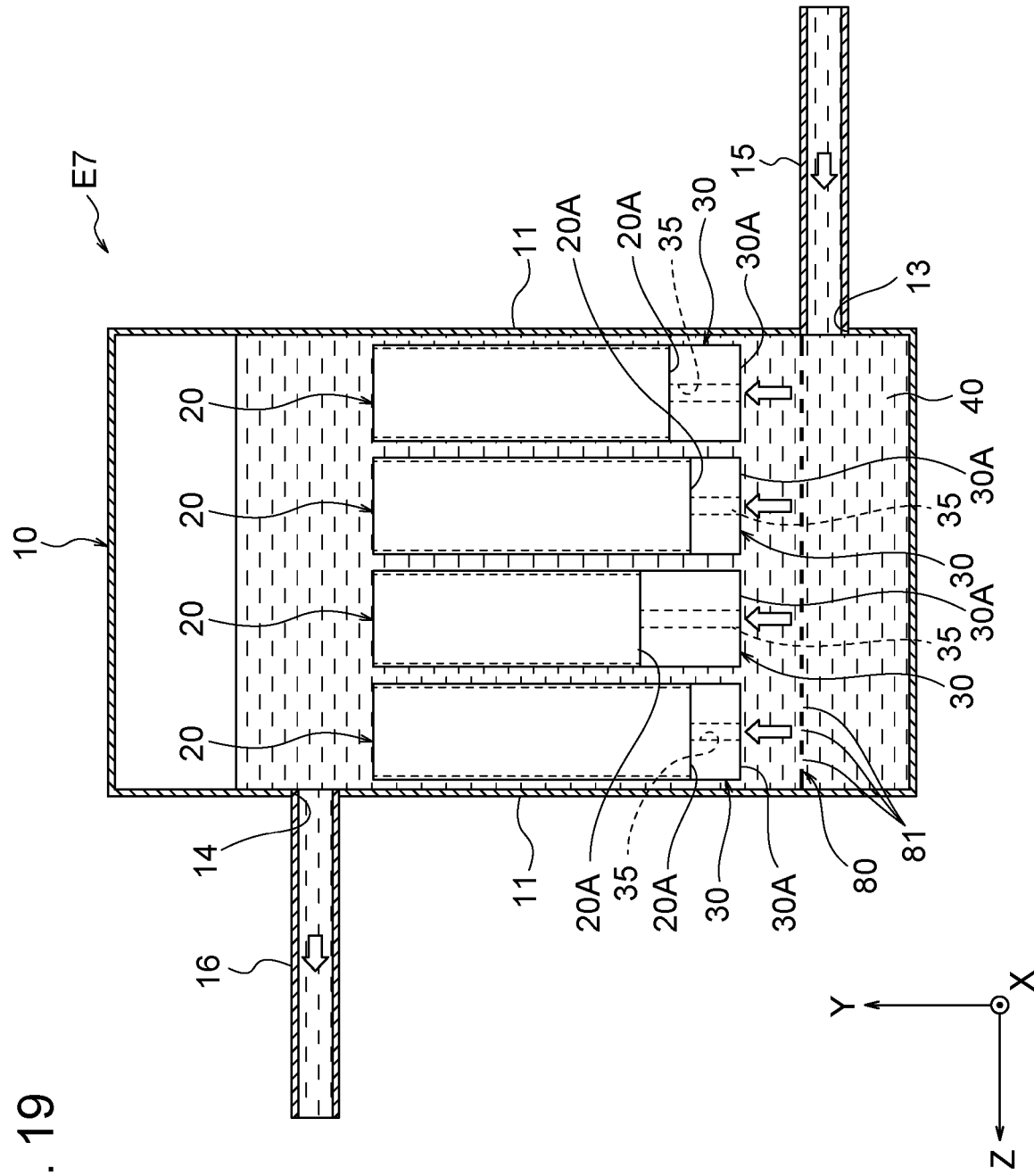
FIG. 19 is a side sectional view of an electronic apparatus according to a seventh embodiment.

A configuration of an electronic apparatus (a cooling apparatus) E7 according to the seventh embodiment illustrated in FIG. 19 is different from the configuration of the electronic apparatus E6 (refer to FIG. 18) according to the sixth embodiment as follows. That is, in the electronic apparatus E7 according to the seventh embodiment, the lengths of the electronic devices 20 in the up-down direction are different from each other, and the lower ends (lower surfaces 20A) of the electronic devices 20 are positioned at different heights. Accordingly, the lengths of the blocks 30 in the up-down direction provided in the electronic devices 20 are different from each other, and the lower ends 30A of the blocks 30 are positioned at the same height.

In this manner, in a case where the lower ends 30A of the blocks 30 are positioned at the same height, the refrigerant 40 may flow uniformly into the through-holes 35 formed in the blocks 30.

Note that the lower ends 30A of the blocks 30 may be positioned at different heights by applying the block 30 having the same length in the up-down direction to the electronic devices 20 of which the lower ends are positioned at different heights.

Eighth Embodiment

Next, an eighth embodiment of the technology disclosed in the present application will be described.

Figure 20:
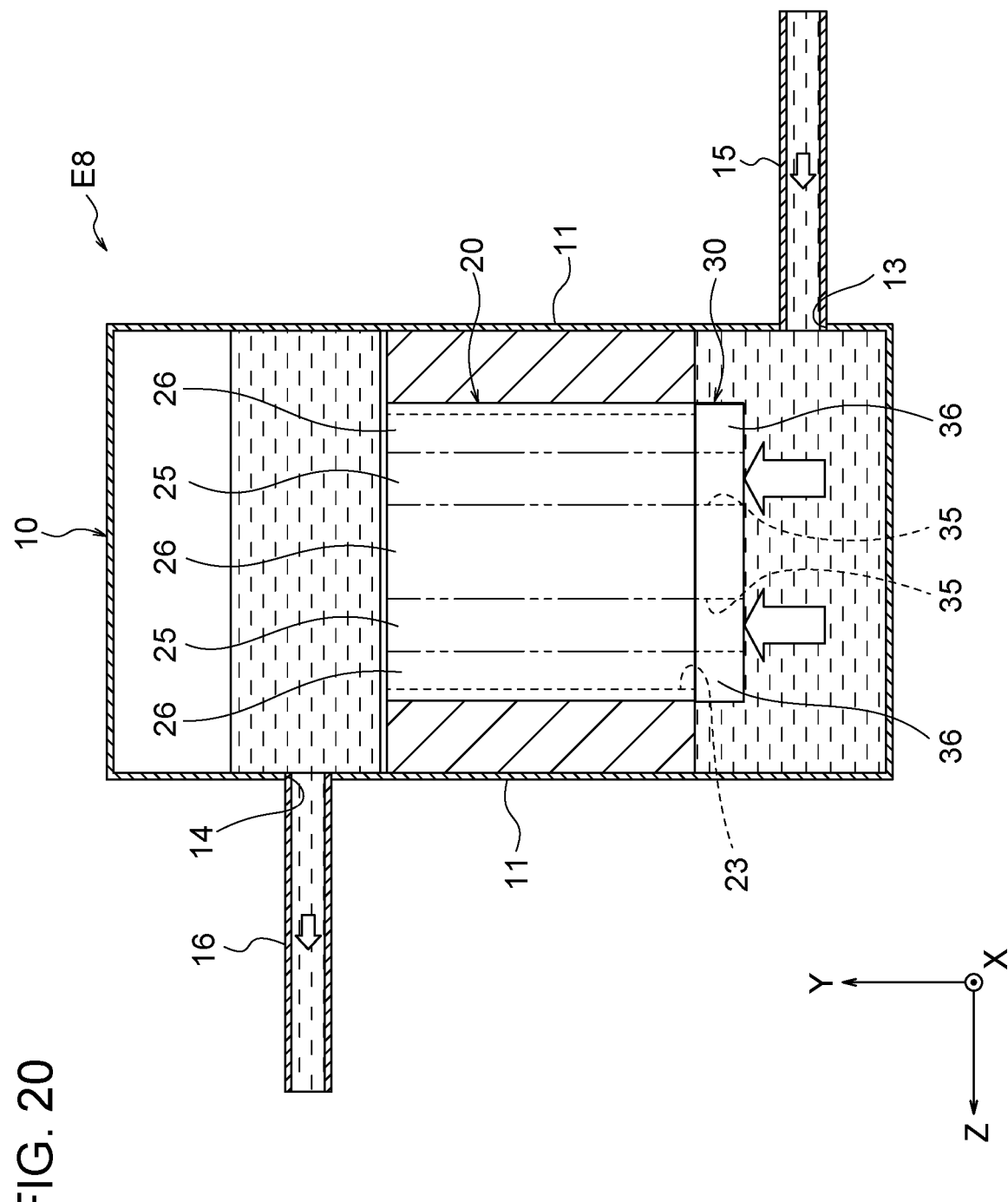
FIG. 20 is a side sectional view of an electronic apparatus according to an eighth embodiment.

A configuration of an electronic apparatus (a cooling apparatus) E8 according to the eighth embodiment illustrated in FIG. 20 is different from the configuration of the electronic apparatus E2 (refer to FIGS. 7 and 8) according to the second embodiment as follows. That is, the electronic apparatus E8 according to the eighth embodiment includes two high-heat generation portions 25 and three low-heat generation portions 26. In addition, the block 30 has a pair of through-holes 35 corresponding to the two high-heat generation portions 25 and three closing portions 36 corresponding to the three low-heat generation portions 26 (see FIG. 21).

Even with such a configuration, similarly to the second embodiment, the high heat generation portion 25 may be preferentially cooled by restricting the flowing of the refrigerant 40 into the low-heat generation portion 26 while guiding the refrigerant 40 to the high-heat generation portion 25, and thus it is possible to improve the cooling efficiency for the high heat generation portions 25. In addition, by using the block 30 having a rectangular parallelepiped shape, it is possible to reduce the amount of the refrigerant 40 to be used, thereby reducing the cost.

The number of high heat generation portions 25 and the number of low-heat generation portions 26 may be any number.

Ninth Embodiment

Next, a ninth embodiment of the technology disclosed in the present application will be described.

Figure 22:
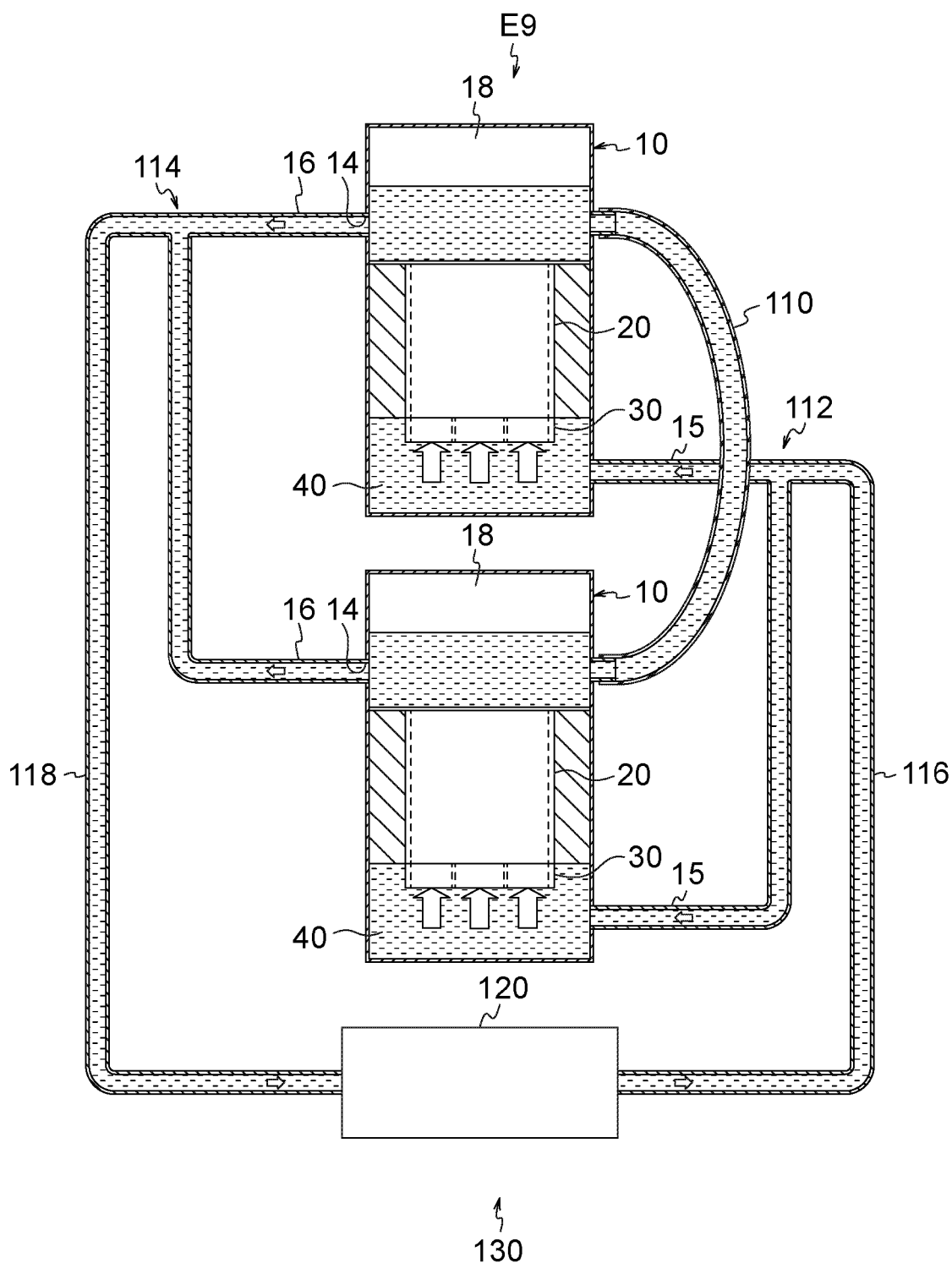
FIG. 22 is a side sectional view of an electronic apparatus according to a ninth embodiment.

A configuration of an electronic apparatus (a cooling apparatus) E9 according to the ninth embodiment illustrated in FIG. 22 is different from the configuration of the electronic apparatus E1 (refer to FIG. 2) according to the first embodiment as follows. That is, the electronic apparatus E9 according to the ninth embodiment includes a pair of immersion tanks 10 and a bypass unit 110.

The refrigerant suction pipes 15 provided in the pair of immersion tanks 10 are connected by a connection unit 112 and the refrigerant discharge pipes 16 provided in the pair of immersion tanks 10 are connected by a connection unit 114. A refrigerant supply pipe 116 is connected to the pair of refrigerant suction pipes 15, and a refrigerant return pipe 118 is connected to the pair of refrigerant discharge pipes 16.

A refrigerant supply device 120 that supplies the refrigerant 40 is connected between the refrigerant supply pipe 116 and the refrigerant return pipe 118. The refrigerant supply device 120 includes, for example, a pump, and a cooling device. The pair of immersion tanks 10 are connected in parallel to the refrigerant supply device 120 via the pair of refrigerant suction pipes 15, the pair of refrigerant discharge pipes 16, the refrigerant supply pipe 116, and the refrigerant return pipe 118. The electronic apparatus E9, the refrigerant supply device 120, and pipes such as the refrigerant supply pipe 116 form an immersion cooling system 130. In the immersion cooling system 130, the refrigerant 40 circulates between the pair of immersion tanks 10 and the refrigerant supply device 120.

Incidentally, in the immersion cooling system 130 in which the pair of immersion tanks 10 are connected in parallel to one refrigerant supply device 120 as described above, the pipe design (pressure loss) of the pair of refrigerant suction pipes 15 may be different in some cases. In such a case, there is a difference in the distribution flow rate of the refrigerant 40 flowing through the pair of refrigerant suction pipes 15 so that the liquid level of the refrigerant 40 in one of the immersion tanks 10 is increased and the liquid level of the refrigerant 40 in the other immersion tank 10 is decreased. Thus, for example, there is a fear that a problem such as leakage of the refrigerant 40 from the upper opening of the immersion tank 10, mixing of air from the refrigerant discharge port 14, and exposure of the electronic device 20 to a gas portion 18 at the top of the immersion tank 10 may occur.

Therefore, the bypass unit 110 is applied to the electronic apparatus E9 according to the ninth embodiment. The bypass unit 110 is, for example, a pipe member such as a hose, and connects the side walls 11 of the pair of immersion tanks 10.

With the electronic apparatus E9 according to the ninth embodiment, when the liquid levels of the refrigerants 40 in the pair of immersion tanks 10 are different from each other, the refrigerant 40 flows from the immersion tank 10 in which the liquid level of the refrigerant 40 is high, to the immersion tank 10 in which the liquid level of the refrigerant 40 is low, through the bypass unit 110. Thus, the liquid level of the refrigerant 40 in the pair of immersion tanks 10 is kept at a certain level. As a result, for example, it is possible to suppress occurrence of a problem such as leakage of the refrigerant 40 from the upper opening of the immersion tank 10, mixing of air from the refrigerant discharge port 14, and exposure of the electronic device 20 to a gas portion 18 at the top of the immersion tank 10.

In the electronic apparatus E9 according to the ninth embodiment, any number of immersion tanks 10 may be used. Further, the number of the bypass units 110 may be plural.

MODIFICATION EXAMPLE

Next, modification examples applicable to the first to ninth embodiments will be described.

Figure 25:
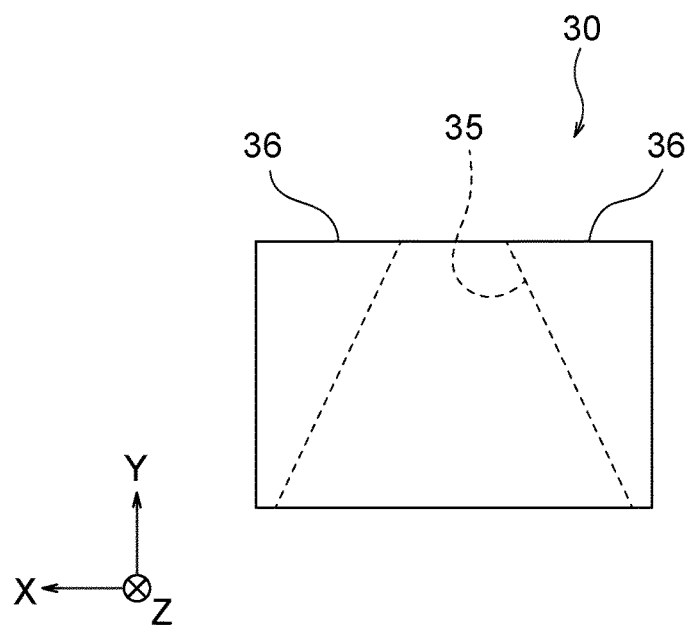
FIG. 25 is a side view of the block of FIG. 23.
Figure 26:
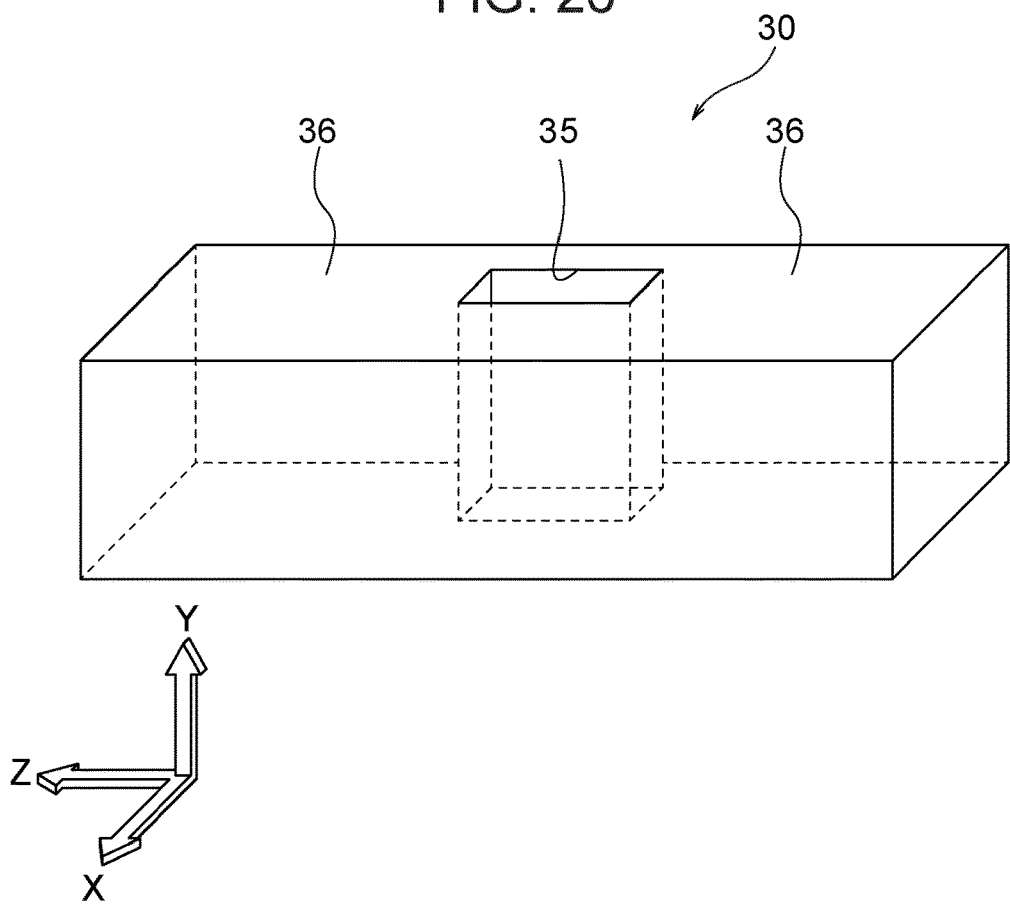
FIG. 26 is a perspective view of a block according to a second modification example.

In each embodiment, the through-hole 35 may be formed in a tapered shape such that the opening area becomes smaller in an upward direction, as illustrated in FIGS. 23 to 25. With such a configuration, the resistance of the flow of the refrigerant 40 may be reduced.

In addition, in each embodiment, the through-hole 35 may be formed at a position shifted from the center of the block 30. Since the high-heat generation portion 25 formed by a substrate or the like (refer to FIGS. 2 and 7) is provided at a position shifted from the center of the electronic device 20 in many cases, the through-hole 35 is formed at a position shifted from the center of the block 30 so as to correspond to the position of the high-heat generation portion 25, and thereby the refrigerant 40 may be guided to the high-heat generation portion 25 by the through-hole 35.

In each embodiment, the refrigerant suction port 13 is formed at the lower portion of the side wall of the immersion tank 10, but the refrigerant suction port 13 may be formed in the lower or bottom wall of the immersion tank 10.

In addition, configurations of each embodiment and the modification example may be implemented by being combined as appropriate.

Although the first to ninth embodiments of the technology disclosed in the present application have been described so far, the technique disclosed in the present application is not limited to the above embodiments, and may be variously modified within the scope not deviating from the gist of the technology disclosed in the present application.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling apparatus comprising:
   an immersion tank having an upright position in an up-down direction and configured to store a refrigerant;
   a refrigerant suction port formed at a lower portion of the immersion tank, the refrigerant suction port being configured to suck the refrigerant from an outside of the immersion tank into an inside of the immersion tank;
   an electronic device immersed in the refrigerant, the electronic device including:
      a first heat generation portion,
      a second heat generation portion having a heat generation amount smaller than a heat generation amount of the first heat generation portion, and
      a refrigerant inlet positioned below the first heat generation portion and the second heat generation portion and being open downward; and
   a block positioned, in the up-down direction, under the first heat generation portion and the second heat generation portion, the block including:
      a through-hole through which a region positioned, in the up-down direction, under the first heat generation portion in the refrigerant inlet is open, and
      a closing portion that closes a region positioned, in the up-down direction, under the second heat generation portion in the refrigerant inlet;
   wherein the block is directly connected to the electronic device, in the up-down direction, under the first heat generation portion and the second heat generation portion of the electronic device.

2. The cooling apparatus according to claim 1, wherein the refrigerant suction port is formed at a lower portion of a side wall of the immersion tank,
   the block is positioned above the refrigerant suction port, and
   a panel having a plurality of straightening holes penetrating the panel in an up-down direction of the immersion tank is disposed between the block and the refrigerant suction port.

3. The cooling apparatus according to claim 1, wherein the through-hole guides the refrigerant sucked from the refrigerant suction port, to the first heat generation portion, and
   the closing portion blocks flowing of the refrigerant sucked from the refrigerant suction port, into the second heat generation portion.

4. The cooling apparatus according to claim 1, wherein the refrigerant suction port is formed below a lower surface of the electronic device, and
   the block is fixed to the lower surface of the electronic device.

5. The cooling apparatus according to claim 1,
   wherein the block has a specific gravity greater than a specific gravity of the refrigerant.

6. The cooling apparatus according to claim 1,
   wherein a lower end of the block is positioned at a height same as a height of an upper edge of the refrigerant suction port.

7. The cooling apparatus according to claim 1,
   wherein the closing portion closes a part of the region positioned below the second heat generation portion in the refrigerant inlet.

8. The cooling apparatus according to claim 1, further comprising:
 a first electronic device immersed in the refrigerant, the first electronic device having a refrigerant inlet that is entirely open downward; and
 a second electronic device as the electronic device having a heat generation amount smaller than a heat generation amount of the first electronic device.

9. The cooling apparatus according to claim 1, further comprising:
 a plurality of the electronic device having lower ends positioned at different heights,
 a plurality of the block attached to the plurality of electronic devices;
 wherein lower ends of the plurality of blocks provided in the electronic devices are positioned at the same height.

10. The cooling apparatus according to claim 1,
 wherein the block has a plurality of the through-hole.

11. The cooling apparatus according to claim 1, wherein the immersion tank is one of a plurality of immersion tanks, and the cooling apparatus further includes:
 a refrigerant supply device configured to supply the refrigerant to the plurality of immersion tanks being connected in parallel to the refrigerant supply device; and
 a bypass unit configured to connect side walls of the plurality of immersion tanks and allow the refrigerant to flow between the immersion tanks.

12. The cooling apparatus according to claim 1,
 wherein an opening area of the through-hole becomes smaller in an upward direction.

13. The cooling apparatus according to claim 1,
 wherein the through-hole is formed at a position shifted from a center of the block.

14. A method for cooling a device, the device including a first heat generation portion and a second heat generation portion, the method comprising:
 providing an opening in the electronic device, the opening positioned, in an up-down direction, under the first heat generation portion and the second heat generation portion;
 providing a direct attachment to the electronic device, the attachment is connected to one end of the electronic device, in the up-down direction, under the first heat generation portion and the second heat generation portion device, the attachment including,
  a through-hole configured to expose the region, in the up-down direction, under the first heat generation portion in the opening;
  a closing portion configured to shield the region, in the up-down direction, under the second heat generation portion in the opening;
 immersing the electronic device with the connected attachment in a container having a cooling substance;
 cooling the electronic device by providing contacting of the cooling substance with the first heat generation portion through the through-hole while having the closing portion restricting contact of the cooling substance with the second heat generation portion.

\* \* \* \* \*